(12) United States Patent
Shin

(10) Patent No.: US 7,881,132 B2
(45) Date of Patent: Feb. 1, 2011

(54) SEMICONDUCTOR MEMORY DEVICE AND OPERATION METHOD THEREOF

(75) Inventor: Beom-Ju Shin, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 205 days.

(21) Appl. No.: 12/346,819

(22) Filed: Dec. 30, 2008

(65) Prior Publication Data

US 2010/0008167 A1     Jan. 14, 2010

(30) Foreign Application Priority Data

Jul. 10, 2008    (KR) .................. 10-2008-0067196

(51) Int. Cl.
*G11C 7/00*        (2006.01)
(52) U.S. Cl. ............... 365/194; 365/191; 365/193; 365/210.1; 365/233.1
(58) Field of Classification Search .......... 365/194, 365/191, 193, 210.1, 233.1
See application file for complete search history.

(56) References Cited

U.S. PATENT DOCUMENTS 7,170,819 B2 *  1/2007 Szczypinski ......... 365/189.05
7,623,398 B2 * 11/2009 Arai ..................... 365/194
7,639,552 B2 * 12/2009 Ku ....................... 365/194

FOREIGN PATENT DOCUMENTS

| KR | 1020030039178 | A | 5/2003 |
| KR | 102005009770 | A | 10/2005 |
| KR | 1020060062426 | A | 6/2006 |
| KR | 100728971 | B1 | 6/2007 |

OTHER PUBLICATIONS

Notice of Allowance issued from Korean Intellectual Property Office on Nov. 19, 2009.

* cited by examiner

*Primary Examiner*—Pho M Luu
(74) *Attorney, Agent, or Firm*—IP & T Group LLP

(57) ABSTRACT

A semiconductor memory device includes a delay locked loop to generate a delay control signal corresponding to a detected phase difference between reference and feedback clock signals, a delay locked loop (DLL) clock signal, and the feedback clock signal. The memory device further includes a delay time measurement device to measure a first degree of delay between the reference and feedback clock signals and output a delay measurement value, and an output enable signal generation device to delay read command information synchronized with an external clock signal by a second degree of delay between the reference and DLL clock signals. The output enable signal generation device generates the read command information as final output enable signal by synchronizing the read command information with the DLL clock signal according to the delay measurement value and column address strobe (CAS) latency information.

34 Claims, 12 Drawing Sheets

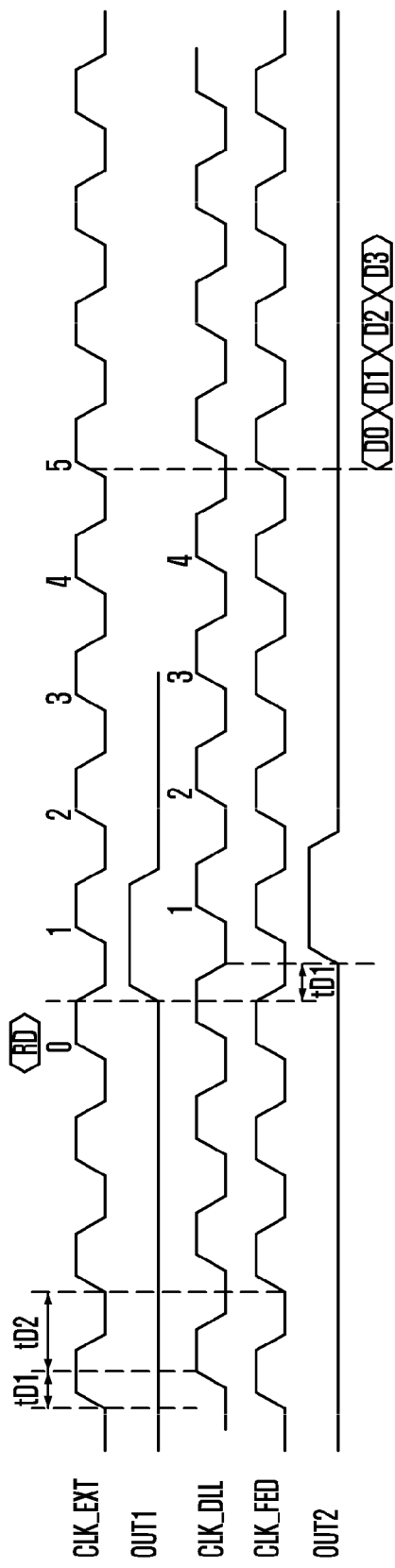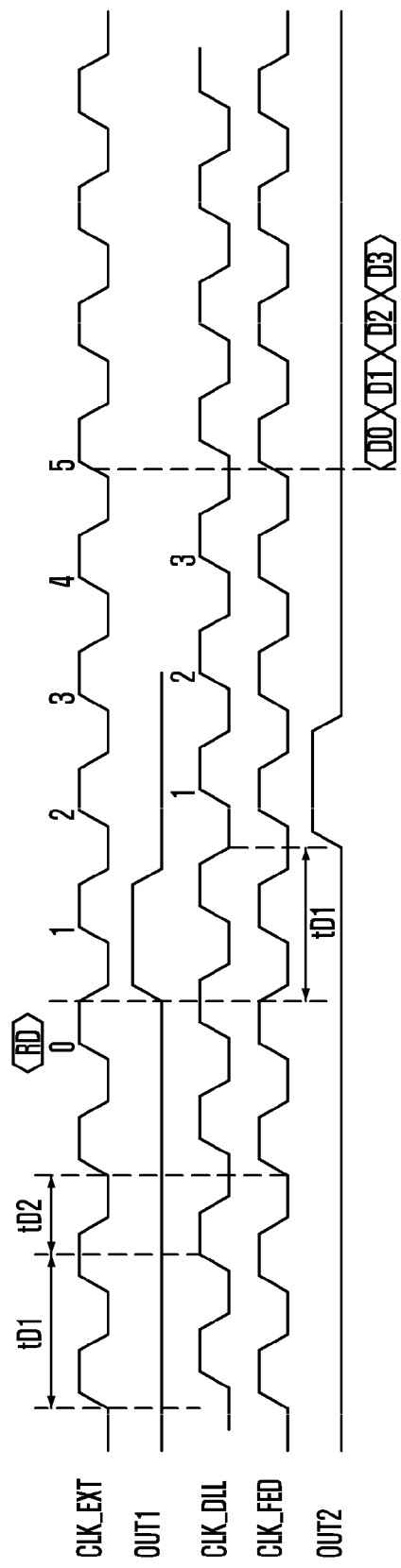

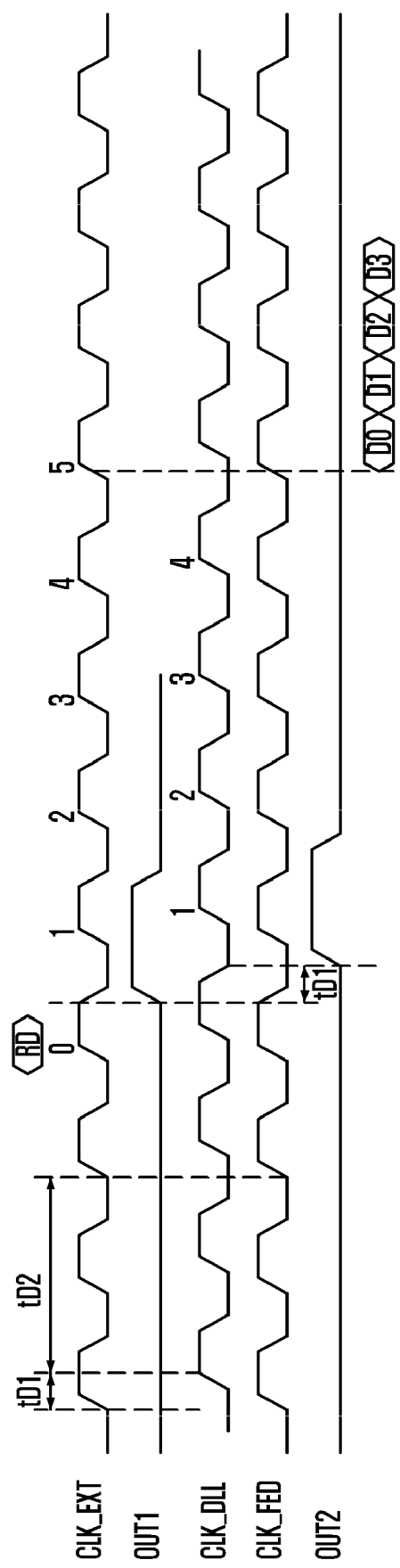

SEMICONDUCTOR MEMORY DEVICE AND OPERATION METHOD THEREOF

CROSS-REFERENCE TO RELATED APPLICATIONS

The present invention claims priority of Korean patent application number 10-2008-0067196, filed on Jul. 10, 2008, which is incorporated by reference in its entirety.

BACKGROUND OF THE INVENTION

The present invention relates to semiconductor design technology, and more particularly, to a semiconductor memory device for outputting a read command applied being synchronized with an external clock signal as an output enable signal in synchronization with an internal clock signal corresponding to Column Address Strobe (CAS) latency information.

In general, a semiconductor memory device including a Double Data Rate Synchronous DRAM (DDR SDRAM) receives a read command from the outside in response to an external clock signal and outputs data stored inside to the outside in response to an internal clock signal. That is, in case of outputting the data, the data is processed by using the internal clock signal instead of the external clock signal inside the semiconductor memory device. Herein, since the read command is applied in synchronization with the external clock signal and the data is outputted in synchronization with the internal clock signal, the semiconductor memory device should include a circuit for synchronizing the read command, which is synchronized with the external clock signal, with the internal clock signal. The clock signal synchronized in view of the read command is changed from the external clock signal to the internal clock signal. Such an operation is generally called "domain crossing".

Meanwhile, the semiconductor memory device domain-crosses the read command from the external clock signal to the internal clock signal and includes an output enable signal generation signal for generating an output enable signal according to CAS latency information. Since the output enable signal is a signal for securing operations for receiving the read command and outputting the data correspondingly to the external clock signal after CAS latency and is domain-crossed, it is synchronized with the internal clock signal. Generally, the CAS latency is stored in a mode resister set included in the semiconductor memory device and has information of whether the read command is applied per a unit time of one period of the external clock signal and the data is outputted correspondingly to nth external clock signal.

Meanwhile, the semiconductor memory device includes a Delay Locked Loop (DLL) for generating the internal clock signal and the output enable signal is synchronized with a DLL clock signal generated by the DLL.

FIG. 1 is a block diagram depicting an output enable signal generation circuit of a conventional semiconductor memory device.

Referring to FIG. 1, the output enable signal generation circuit includes a counter reset signal generation unit 110, a reset unit 120, a DLL clock counting unit 130, an Output Enable (OE) delay replica model unit 140, an external counting unit 150, a counting value latching unit 160, and a counting value comparison unit 170.

The counter reset signal generation unit 110 generates a first reset signal RSTb_DLL for resetting the DLL clock counting unit 130 by synchronizing a reset signal RSTb with a clock signal CLK_DLL.

The reset unit 120 supplies an initial counting value INT<0:2> corresponding to CAS latency CL to the DLL clock counting unit 130. Herein, the initial counting value INT<0:2> is described by employing a 3 bit code signal as one example. Initial counting values are set in the reset unit 120 correspond to CAS latency CL 3 to 6 and the initial counting values INT<0:2> outputted from the reset unit 120 corresponding to the initial counting set values are described in the following Table 1.

TABLE 1

| CL | Initial counting set value | INT<2> | INT<1> | INT<0> |
|---|---|---|---|---|
| 3 | 5 | 1 | 0 | 1 |
| 4 | 4 | 1 | 0 | 0 |
| 5 | 3 | 0 | 1 | 1 |
| 6 | 2 | 0 | 1 | 0 |

For reference, the CAS latency CL, the initial counting set values corresponding to the CAS latency CL and the initial counting values INT<0:2> in Table 1 are changeable depending on a design.

The DLL clock counting unit 130 performs a counting operation in response to the first reset signal RSTb_DLL. That is, the DLL clock counting unit outputs a DLL clock counting value CNT_DLL<0:2> counted from the initial counting value INT<0:2> in response to the DLL clock signal CLK_DLL according to the first reset signal RSTb_DLL. For instance, if the initial counting set value INT<0:2> is set as 4 according to the CAS latency, the DLL clock counting unit 130 outputs the DLL clock counting value CNT_DLL <0:2> counted from 4 in response to the DLL clock signal CLK_DLL. Herein, the DLL clock counting unit 130 employs a general 3-bit counter as one example.

The OE delay replica model unit 140 outputs a second reset signal RSTb_EXT by delaying the first reset signal RSTb_DLL as modeling a delay degree between the DLL clock signal CLK_DLL and the external clock signal CLK_EXT. Herein, the OE delay replica model unit 140 has a similar construction to that of a DLL delay replica model unit (not shown in the drawing).

The external clock counting unit 150 performs a counting operation in response to the second reset signal RSTb_EXT. That is, it outputs an external clock counting value CNT_EXT<0:2> counted in response to the external clock signal CLK_EXT according to the second reset signal RSTb_EXT. The external clock counting unit 150, unlike the DLL clock counting unit 130, is set with an initial counting value of 0. In other words, after the second reset signal RSTb_EXT is activated, the external clock counting value CNT_EXT<0:2> is counted from 0 in response to the external clock signal CNT_EXT. Herein, the external clock counting unit 150, similar to the DLL clock counting unit 130, employs a general 3-bit counter as one example.

The counting value latching unit 160 latches the external clock counting value CNT_EXT<0:2> in response to a read command signal RD_EN and outputs it as the latched external clock counting value LAT_CNT<0:2>. Herein, the read command signal RD_EN is a pulse signal activated in response to the read command applied being synchronized with the external clock signal CLK_EXT.

The counting value comparison unit 170 compares the DLL clock counting value CNT_DLL<0:2> with the latched external clock counting value LAT_CNT<0:2> in order to output an output enable signal OE activated at a time when the two values are equal to each other. Herein, the output enable signal OE is a signal synchronized with the DLL clock signal CLK_DLL, i.e., the result obtained by synchronizing the read command applied after being synchronized with the external clock signal CLK_EXT with the DLL clock signal CLK_DLL. In other words, the read command becomes the output enable signal OE by being domain-crossed from the external clock signal CLK_EXT to the DLL clock signal CLK_DLL. At this time, the output enable signal OE is reflected by the CAS latency CL.

Herein, since specific circuit constructions for the counter reset signal generation unit 110, the reset unit 120, the DLL clock counting unit 130, the OE delay replica model unit 140, the external clock counting unit 150, the counting value latching unit 160, and the counting value comparison unit 170 are already widely known, the detail description thereof will be omitted.

FIG. 2 is a waveform diagram illustrating an operation timing of the output enable signal generation circuit shown in FIG. 1. For convenience of explanation, the case that the CAS latency CL is 4 is illustrated as "CL4", the case that the CAS latency CL is 5 is illustrated as "CL5" and the case that the CAS latency CL is 6 is illustrated as "CL6".

First of all, the case that the CAS latency CL is 4 will be described.

The initial counting value of the reset unit 120 is set with 4 according to Table 1. If the first reset signal RST_DLL is activated to logical 'high', the DLL clock counting unit 130 outputs the DLL clock counting value CNT_DLL<0:2> counted from 4 as the initial counting value in response to the DLL clock CLK_DLL.

Meanwhile, the OE delay replica model unit 140 outputs the second reset signal RSTb_EXT by reflecting a delay time D to the first reset signal RSTb_DLL. If the second reset signal is activated to logical 'high', the external clock counting unit 150 outputs the external clock counting value CNT_EXT<0:2> counted from 0 in response to the external clock signal CLK_EXT.

At this time, if the read command signal RD_EN is activated by receiving the read command RD, the counting latching unit 160 outputs an external clock counting value CNT_EXT<0:2> of 3 as a latched external clock counting value LAT_CNT<0:2>. The counting value comparison unit 170 compares the DLL clock counting value CNT_DLL<0:2> with the latched external clock counting value LAT_CNT<0:2> in order to activate the output enable signal OE at a time when the two values are equal to each other, i.e., the DLL clock counting value CNT_DLL<0:2> becomes 3. The semiconductor memory device has the thus-activated output enable signal OE and outputs data at a time of the external clock signal CLK_EXT of 4.

Semiconductor memory devices with high speed and low power consumption have been developed recently. However, the conventional output enable signal generation circuit has the following disadvantages in terms of high speed and low power consumption.

First of all, as an operation frequency of the semiconductor memory device increases, it is inevitable that the CAS latency CL increases. Since the counters constituting the DLL clock counting unit 130 and the external clock counting unit 150 are designed correspondingly to the CAS latency CL, if the CAS latency increases, the counters should be also designed to have more bits. When considering that the operation of a 4-bit counter is slower than that of a 3-bit counter, as the CAS latency CL increases, the counter is larger and the operation is slower. In addition, the counting value comparison unit 170 is also slower as the number of compared bits increases. These problems are elements retarding the high speed of the semiconductor memory device.

And, since the conventional output enable signal generation signal has a structure for latching the external clock counting value CNT_EXT<0:2> at a time when the read command signal RD_EN is activated, the DLL clock counting unit 130 and the external clock counting 150 should perform the counting operations at least before the read command signal RD_EN is activated. Specifically, before the read command is applied, the counter receiving the external clock signal CLK_EXT and the counter receiving the DLL clock signal CLK_DLL should perform counting operations continuously. This means that power is continuously consumed before the read command is applied, which increases power consumption.

SUMMARY OF THE INVENTION

The present invention has been proposed in order to overcome the above-described problems in the background of the invention. Embodiments of the invention are directed to providing a delay locked loop circuit capable of reducing power consumption.

In accordance with an aspect of the invention, there is provided a semiconductor memory device, including: a delay locked loop configured to generate a delay control signal corresponding to a detected phase difference between a reference clock signal and a feedback clock signal by detecting the phase difference, and to generate a Delay Locked Loop (DLL) clock signal by delaying the reference clock signal by an amount corresponding to the delay control signal and delaying the feedback clock signal obtained by reflecting a delay time of a practical clock/data path to the DLL clock signal; a delay and delay time measurement device configured to measure a delay degree between the reference clock signal and the feedback clock signal in response to locking finishing information synchronized with an external clock signal and output the delay degree as a delay measurement value; and an output enable signal generation device configured to delay read command information synchronized with the external clock signal by a delay degree between the reference clock signal and the DLL clock signal and generate the read command information as a final output enable signal by synchronizing the read command information with the DLL clock signal according to the delay measurement value and Column Address Strobe (CAS) latency information.

In accordance with another aspect of the invention, there is provided a semiconductor memory device, including: a selection output device unit configured to selectively output read command information and locking finishing information according to a normal mode and a measurement mode by synchronizing the read command information and the locking finishing information with an external clock signal; a delay locked loop configured to generate a delay control signal corresponding to a detected phase difference between a reference clock signal and a feedback clock signal by detecting the phase difference, a Delay Locked Loop (DLL) clock signal by delaying the reference clock signal by an amount corresponding to the delay control signal and delaying the feedback clock signal obtained by reflecting a delay time of a practical clock/data path to the DLL clock signal; a variable delay device configured to output an output signal of the selection output device by delaying the output signal by corresponding to a delay degree between the reference clock signal and the DLL clock signal; a delay time measurement unit configured to receive an output signal of the variable delay device, measure a delay degree between the reference clock signal and the feedback clock signal and output the delay degree as a delay measurement value; and an output enable signal output device configured to synchronize the output signal of the variable delay device with the DLL clock signal and output the output signal as a final output enable signal according to the delay measurement value and Column Address Strobe (CAS) latency information.

In accordance with still another aspect of the invention, there is provided an operation method of a semiconductor memory device, including: generating a delay control signal corresponding to a detected phase difference between a reference clock signal and a feedback clock signal by detecting the phase difference, generating a Delay Locked Loop (DLL) clock signal by delaying the reference clock signal by an amount corresponding to the delay control signal and delaying the feedback clock signal obtained by reflecting a delay time of a practical clock/data path to the DLL clock signal; generating a delay measurement value obtained by measuring a delay degree between the reference clock signal and the feedback clock signal after a locking operation; and generating a final output enable signal according to the delay measurement value and Column Address Strobe (CAS) latency in response to a read command.

BRIEF DESCRIPTION OF THE DRAWINGS

FIGS. 4A to 4C are waveform diagrams illustrating general operations of the invention.

DESCRIPTION OF SPECIFIC EMBODIMENTS

In order to describe in detail such that those skilled in the art easily implement the spirit and scope of the present invention, the embodiments of the invention will be described with reference to the accompanying drawings.

Figure 1:
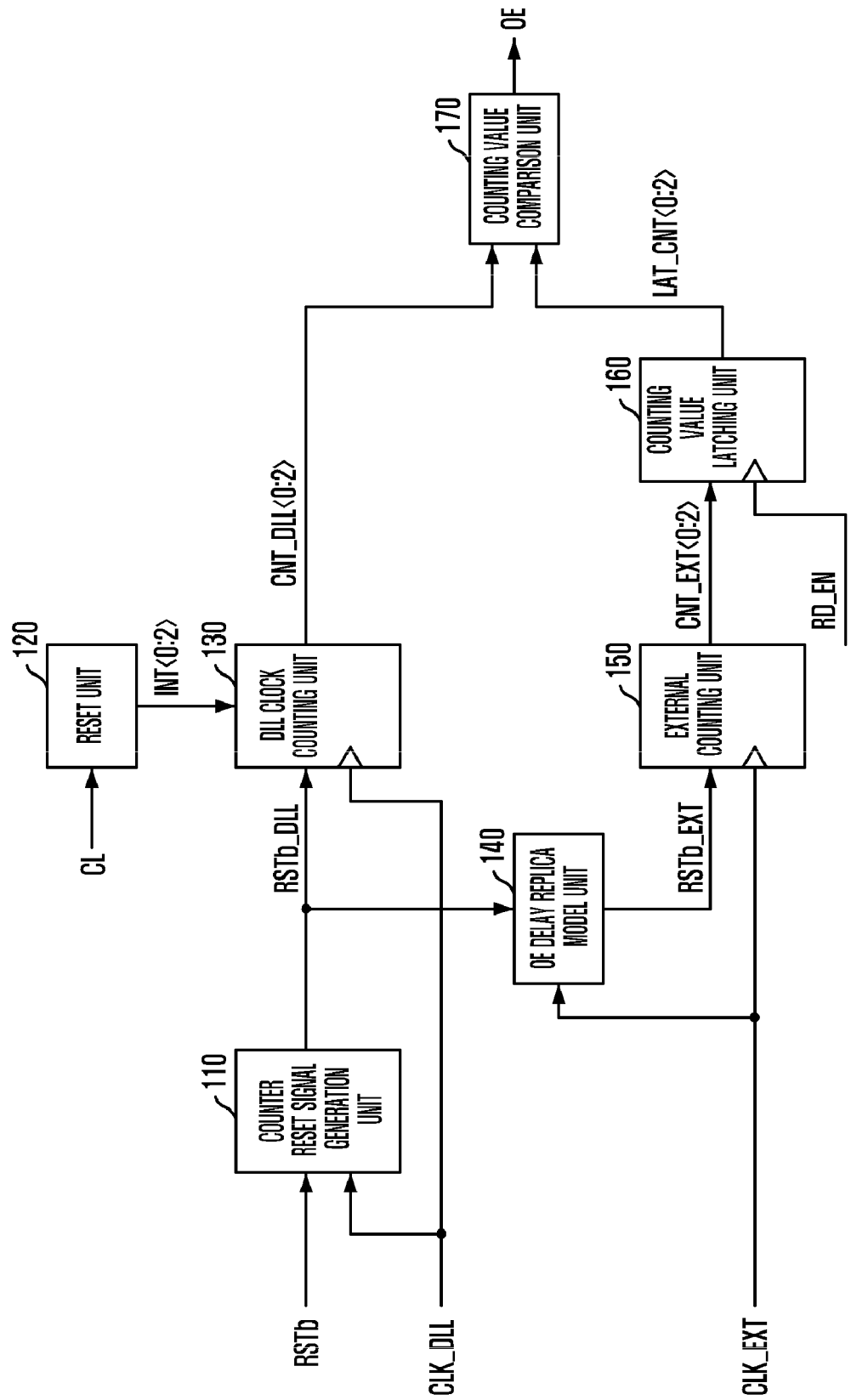
FIG. 1 is a block diagram depicting an output enable signal generation circuit of a conventional semiconductor memory device.
Figure 2:
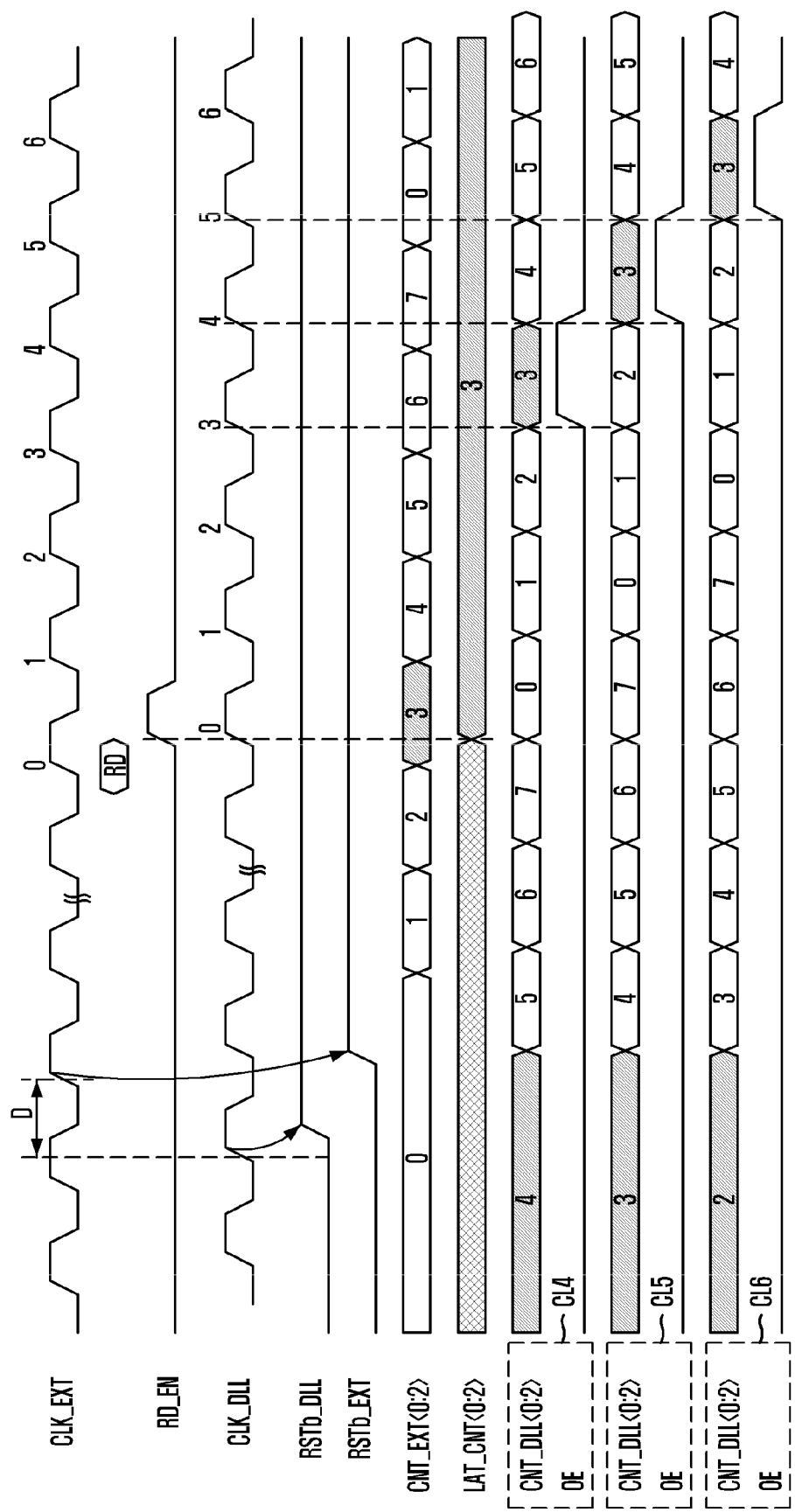
FIG. 2 is a waveform diagram depicting an operation timing of the output enable signal generation circuit shown in FIG. 1.
Figure 3:
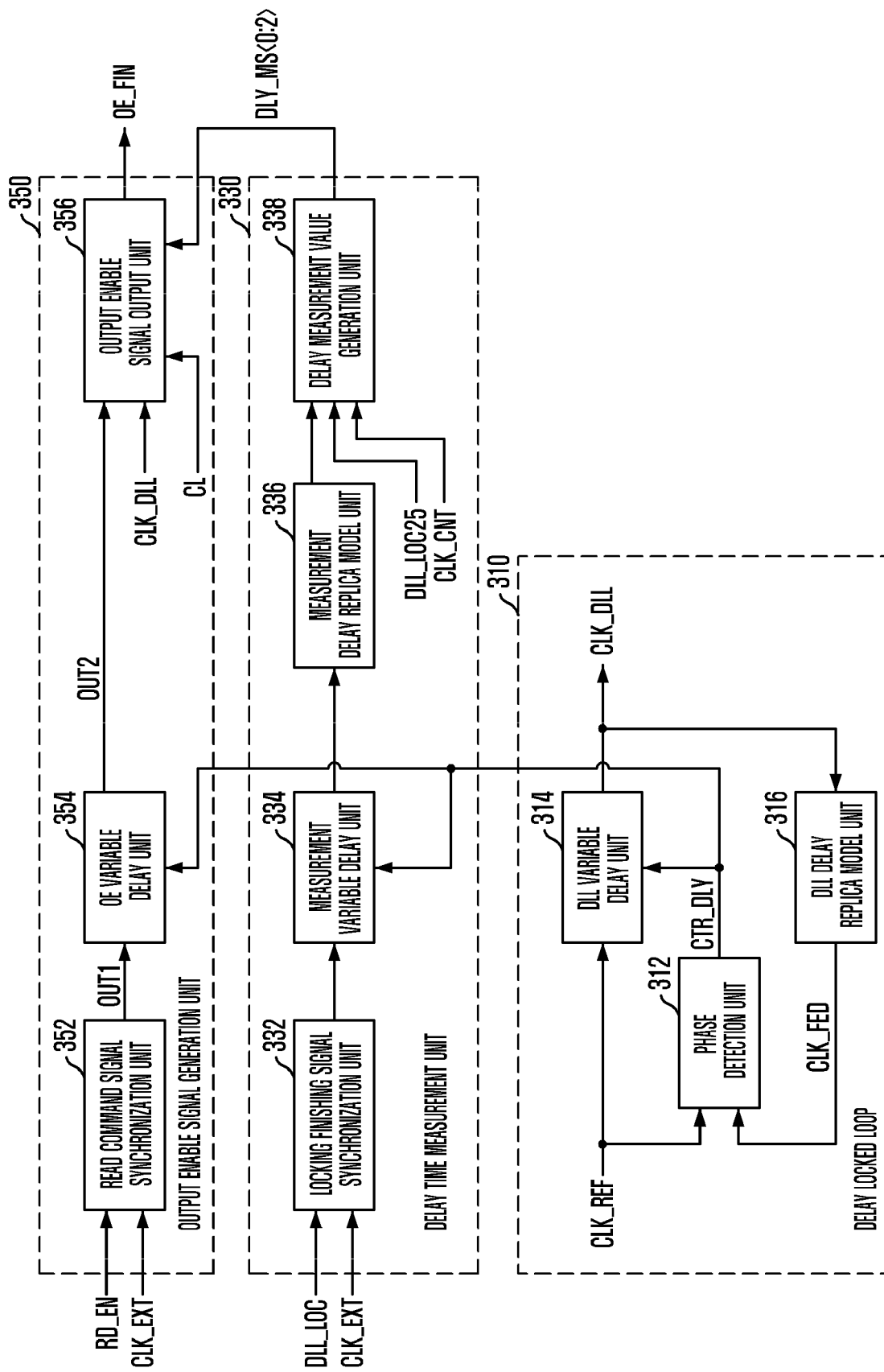
FIG. 3 is a block diagram illustrating some components of a semiconductor memory device in accordance with a first embodiment of the present invention.

FIG. 3 is a block diagram illustrating some components of a semiconductor memory device in accordance with a first embodiment of the invention.

Referring to FIG. 3, the semiconductor memory device includes a delay locked loop 310, a delay and a delay time measurement unit 330 and an output enable signal generation unit 350.

The delay locked loop 310 generates a Delay Locked Loop (DLL) clock signal CLK_DLL as an internal clock signal by receiving a reference clock signal CLK_REF and includes a phase detection unit 312, a DLL variable delay unit 314 and a DLL delay replica model unit 316. Herein, the reference clock signal CLK_REF can be a signal generated by buffering an external clock signal. Since the delay locked loop 310 is a general component, detailed circuit construction thereof will be omitted and a simple operation of each component thereof will be described hereafter.

The phase detection unit 312 detects a phase difference between the reference clock CLK_REF and a feedback clock signal CLK_FED and generates a delay control signal CTR_DLY corresponding to the phase difference. And, the DLL variable delay unit 314 generates a DLL clock signal CLK_DLL by delaying the reference clock signal CLK_REF by an amount corresponding to the delay control signal CTR_DLY. Lastly, the DLL delay replica model unit 316 generates the feedback clock signal CLK_FED by reflecting a delay time of a practical clock/data path to the DLL clock signal CLK_DLL.

Hereafter, a simple operation of the delay locked loop 310 will be described.

First of all, the reference clock signal CLK_REF is inputted to the DLL variable delay unit 314 and outputted as the DLL clock signal by being delayed by an initially set basic delay time. The DLL clock signal CLK_DLL is outputted as the feedback signal CLK_FED by being delayed by the delay time of the practical clock/data path. The phase detection unit 312 detects the phase difference between the reference signal CLK_REF and the feedback clock signal CLK_FED, wherein in case that the feedback clock signal CLK_FED is in advance of a corresponding phase of the reference clock signal CLK_REF, the phase detection unit 312 generates the corresponding delay control signal in order to control the DLL variable delay unit 314 to output the reference clock signal CLK_REF after delaying it just a little more. The delay locked loop 310 repeatedly performs the above-mentioned operations until the phases of the reference clock signal CLK_REF and the feedback clock signal CLK_FED are equal to each other. Generally, such an operation of the delay locked loop 310 is called "locking operation" and that the phases of the reference clock signal CLK_REF and the feedback clock signal CLK_FED are equal to each other is called "locking".

Although not shown in the drawing, the delay locked loop 310 outputs a locking finishing signal DLL_LOC for giving information of a locking finishing after a locking operation. The locking finishing signal DLL_LOC can be inputted to various circuits inside the semiconductor memory device depending on a use.

Meanwhile, the delay time measurement unit 330 measures a delay degree between the reference clock signal CLK_REF and the feedback clock signal CLK_FED in response to the locking finishing signal DLL_LOC in order to output the delay degree as a delay measurement value DLY_MS<0:2> and includes a locking finishing signal synchronization unit 332, a measurement variable delay unit 334, a measurement delay replica model unit 336 and a delay measurement value generation unit 338. Detailed circuits and circuit operations of components constituting the delay and delay time measurement unit 330 will be described in a second embodiment and hereafter, each of the components of the delay and delay time measurement unit 330 will be described in brief.

The locking finishing signal synchronization unit 332 can output the locking finishing signal DLL_LOC after synchronizing it with the external clock signal CLK_EXT.

The measurement variable delay unit 334 delays an output signal of the locking finishing signal synchronization unit 332 by a delay degree between the reference clock signal CLK_REF and the DLL clock signal CLK_DLL, wherein the measurement variable delay unit 334 can output the output signal of the locking finishing signal synchronization unit 332 after delaying by an amount corresponding to the delay control signal CTR_DLY. That is, since the measurement variable delay unit 334 has a similar construction to that of the DLL variable delay unit 314 and performs a delay operation by being controlled by the delay control signal CTR_DLY, it can have a similar delay time to that of the DLL variable delay unit 314.

The measurement delay replica model unit 336 can output an output signal of the measurement variable delay unit 334 after delaying it by a delay degree between the DLL clock signal CLK_DLL and the feedback clock signal CLK_FED. Namely, since the measurement delay replica model unit 336 has a similar construction to that of the DLL delay replica model unit 316, it can output the output signal of the measurement variable delay unit 334 after delaying it by the delay time of the practical clock/data path.

Herein, in order to describe the measurement delay replica model unit 336 in more detail, a counting clock signal CLK_CNT inputted to the delay measurement value generation unit 338 will be described. The counting clock signal CLK_CNT, similar to the reference clock signal CLK_REF, is generated by using the external clock signal CLK_EXT as a source. If the counting clock signal CLK_CNT and the reference clock signal CLK_REF have the same phase, it is desirable that the measurement delay replica model unit 336 and the DLL delay replica model unit 316 are designed equally. However, the reference clock signal CLK_REF and the counting clock signal CLK_CNT pass through different transmission lines from each other until they are inputted to the corresponding circuits individually, which causes a skew between the two clock signals. Therefore, it is desirable that the measurement delay replica model unit 336 is designed by reflecting ±Δ(the skew between the two clock signals) to the delay time reflected in the DLL delay replica model unit 316. For convenience of explanation, the skew between the two clock signals is not considered in the specification.

The delay measurement value generation unit 338 counts the counting clock signals CLK_CNT in response to a signal DLL_LOC25 obtained by synchronizing the locking finishing signal DLL_LOD with the external clock signal CLK_EXT and an output signal of the measurement delay replica model unit 336 and generates it as a delay measurement value DLY_MS<0:2>. Herein, the delay measurement value DLY_MS<0:2> uses a 3 bit code signal, and this is changeable depending on a design. The signal DLL_LOC25 obtained by synchronizing the locking finishing signal DLL_LOD with the external clock signal CLK_EXT will be described in detail through the second embodiment.

The delay measurement value DLY_MS<0:2> in accordance with the invention can have a value corresponding to the delay degree between the reference clock signal CLK_REF and the feedback clock signal CLK_FED after finishing the locking operation through the locking operation of the delay locked loop 310. That is, the delay measurement value DLY_MS<0:2> has a value corresponding to a delay time in which the synchronized locking finishing signal passes through the measurement variable delay unit 334 and the measurement delay replica model unit 336. In other words, since the measurement variable delay unit 334 is reflected by the same delay time as that of the DLL variable delay unit 314 and the measurement delay replica model unit 336 is reflected by the same time as that of the DLL delay replica model unit 316, the delay measurement value DLY_MS<0:2> can have the value corresponding to the delay degree between the reference clock signal CLK_REF and the feedback clock signal CLK_FED.

Meanwhile, the output enable signal generation unit 350 delays a read command signal synchronized with the external clock signal CLK_EXT by a delay degree between the reference clock signal CLK_REF and the DLL clock signal CLK_DLL and synchronizes the delayed read command signal with the DLL clock signal CLK_DLL by corresponding to a CAS latency CL and the delay measurement value DLY_MS<0:2> in order to generate a final output enable signal OE_FIN. Herein, the output enable signal generation unit 350 includes a read command signal synchronization unit 352, an OE variable delay unit 354 and an output enable signal output unit 356. Detailed circuits and circuit operations of components constituting the output enable signal generation unit 350 will be described in the second embodiment and hereafter, each of the components of the output enable signal generation unit 350 will be described in brief.

The read command signal synchronization unit 352 outputs the read command signal RD_EN after synchronizing it with the external clock signal CLK_EXT. Herein, the read command signal RD_EN is a signal which is activated in response to a read command applied from the outside after the locking operation.

The OE variable delay unit 354 delays an output signal OUT1 of the read command signal synchronization unit 352 by the delay degree between the reference clock signal CLK_REF and the DLL clock signal CLK_DLL, wherein the OE variable delay unit 354 can output the output signal OUT1 of the read command signal synchronization unit 352 after delaying it by the amount corresponding to the delay control signal CTR_DLY. That is, since the OE variable delay unit 354 has a similar construction to that of the DLL variable delay unit 314 and performs a delay operation by being controlled by the delay control signal CTR_DLY, it can have a similar delay time to that of the DLL variable delay unit 314.

Although described again hereafter, if the read command signal synchronized with the external clock signal CLK_EXT is delayed by a delay time corresponding to the DLL variable delay unit 413 of the delay locked loop 310, i.e., the delay time reflected in the OE variable delay unit 354, the signal is positioned around a corresponding edge of the DLL clock signal CLK_DLL. Thereafter, if an output signal OUT2 of the thus-delayed OE variable delay unit 354 is synchronized with the DLL clock signal CLK_DLL, the domain-crossing is executed. At this time, the domain-crossing is reflected by the delay time of the DLL variable delay unit 314, which will be described in more detail through FIGS. 4A to 4C.

The output enable signal output unit 356 outputs the output signal OUT2 of the OE variable delay unit 354 as the final output enable signal OE_FIN which is synchronized with the DLL clock signal CLK_DLL by corresponding to the CAS latency CL and the delay measurement value DLY_MS<0:2>. Herein, the final output enable signal OE_FIN can be synchronized with the DLL signal CLK_DLL and secure an operation for outputting data with matching with the CAS latency CL with respect to the external clock signal.

FIGS. 4A to 4C are waveform diagrams illustrating general operations of the invention. Before describing the waveform diagrams, reference numerals shown in the drawings are described. TimetD1 is the delay time reflected to the DLL variable delay unit 314 in a locking state and timetD2 is the delay time reflected by the DLL delay replica model unit 316. That is, tD1 indicates the delay degree between the reference clock signal CLK_REF and the DLL clock signal CLK_DLL in the locking state and tD2 indicates the delay degree between the DLL clock signal CLK_DLL and the feedback clock signal CLK_FED. And, for convenience of explanation, FIGS. 4A to 4C illustrate the case that the CAS latency CL is set as 5 as one example. And, in FIGS. 4A to 4C, the external clock signal CLK_EXT, the output signal OUT1 of the read command signal synchronization unit 352, the DLL clock signal CLK_DLL, the feedback clock signal CLK_FED and the output signal OUT2 of the OE variable delay unit 354 are illustrated and for convenience of explanation, the output signal OUT1 of the read command signal synchronization unit 352 is called a "first output signal" and the output signal OUT2 of the OE variable delay unit 354 is called a "second output signal".

Hereafter, the general operation of the invention will be described with reference to FIG. 3 and FIG. 4A.

First of all, when the locking operation is finished through the locking operation of the delay locked loop 310 before the read command is applied, as shown in the drawings, the delay time between the external clock signal CLK_EXT and the DLL clock signal CLK_DLL is tD1 and the delay time between the DLL clock signal CLK_DLL and the feedback clock signal CLK_FED is tD2. Namely, FIG. 4A illustrates the case that the sum of tD1 and tD2 is 1tCK. Although described again hereafter, the delay measurement value DLY_MS<0:2> can have a value corresponding to the total delay time of tD1 and tD2.

In a state of finishing the locking operation, if the read command RD is applied, the read command signal RD_EN is activated and becomes the first output signal OUT1 in synchronization with a falling edge of the external clock signal CLK_EXT in the read command signal synchronization unit 352. Thereafter, the first output signal OUT1 becomes the second output signal OUT2, which is delayed by tD1 in the OE variable delay unit 354. As shown in the drawings, the second output signal OUT2 is naturally positioned around a falling edge of the DLL clock signal.

The generated second output signal OUT2 can be outputted as the final output enable signal OE_FIN through a shifting operation in response to the DLL clock signal CLK_DLL. Herein, the shifting operation can be performed as set. In FIG. 4A, since the sum of 'tD1' and tD2 is 1tCK, the second output signal OUT2 can perform the shifting operation by 4 obtained by subtracting it from the CAS latency 5. That is, the second output signal OUT2 is the final output enable signal OE_FIN activated in response to a time when the DLL clock signal CLK_DLL is 4 and first to fourth data D0, D1, D2 and D3 can be outputted in response to the thus-activated final output enable signal OE_FIN. If the CAS latency is 4, the final output enable signal OE_FIN is activated in response to a time when the DLL clock signal is 3 and the first to fourth data D0, D1, D2 and D3 can be outputted in response to the thus-activated final output enable signal OE_FIN.

Thereafter, if in a state of the CAS latency CL of 5, the final output enable signal OE_FIN should be activated earlier than the CAS latency CL by, e.g., 1tCK by a timing inside the semiconductor memory device, the second output signal OUT2 can perform the shifting operation by a value obtained by subtracting 1 corresponding to 1tCK due to the timing inside the semiconductor memory device from the CAS latency CL 5 and additionally subtracting 1 as the sum of 'tD1' and 'tD2'. That is, the second output signal OUT2 can be the final output enable signal OE_FIN activated in response to a time when the DLL clock signal CLK_DLL is 3.

Hereafter, the general operation of the invention will be described with reference to FIG. 3 and FIG. 4B.

FIG. 4B illustrates the case that the sum of 'tD1' and 'tD2' is 2tCK. In case of a semiconductor memory device with a relatively low operation frequency, as shown FIG. 4A, the sum of 'tD1' and 'tD2' is 1tCK in most cases, however, more recently, in the case of a semiconductor memory device with a high operation frequency, the sum of 'tD1' and 'tD2' exceeds 1tCK in many cases. For reference, the sum of 'tD1' and 'tD2' is N multiples of 1 tCK (Herein, N is a natural number) after the locking operation.

In a state of finishing the locking operation, if the read command RD is applied, the read command signal RD_EN is activated and becomes the first output signal OUT1 in synchronization with the falling edge of the external clock signal CLK_EXT in the read command signal synchronization unit 352. Thereafter, the first output signal OUT1 becomes the second output signal OUT2 which is delayed by tD1 in the OE variable delay unit 354 and the second output signal OUT2, similar to FIG. 4A, is naturally positioned around the falling edge of the DLL clock signal.

The thus-generated second output signal OUT2 performs the shifting operation in response to the DLL clock signal CLK_DLL and in FIG. 4B, since the sum of tD1 and tD2 is 2tCK, the second output signal OUT2 can perform the shifting operation by 3 obtained by subtracting it from the CAS latency 5. That is, the second output signal OUT2 is the final output enable signal OE_FIN activated in response to a time when the DLL clock signal CLK_DLL is 3 and first to fourth data D0, D1, D2 and D3 can be outputted in response to the thus-activated final output enable signal OE_FIN.

Hereafter, the general operation of the invention will be described with reference to FIG. 3 to FIG. 4C. Herein, the sum of tD1 and tD2 is 2tCK.

In a state of finishing the locking operation, if the read command RD is applied, the read command signal RD_EN is activated and becomes the first output signal OUT1 in synchronization with the falling edge of the external clock signal CLK_EXT in the read command signal synchronization unit 352. Thereafter, the first output signal OUT1 becomes the second output signal OUT2 which is delayed by tD1 in the OE variable delay unit 354 and the second output signal OUT2, similar to FIG. 4B, is naturally positioned around the falling edge of the DLL clock signal.

The thus-generated second output signal OUT2 performs the shifting operation in response to the DLL clock signal CLK_DLL and in FIG. 4C, since the sum of tD1 and tD2 is 2tCK, the second output signal OUT2 can perform the shifting operation by 3 obtained by subtracting it from the CAS latency 5. That is, the second output signal OUT2 is the final output enable signal OE_FIN activated in response to a time when the DLL clock signal CLK_DLL is 3 and first to fourth data D0, D1, D2 and D3 can be outputted in response to the thus-activated final output enable signal OE_FIN.

As described above, the semiconductor memory device in accordance with the invention can generate the delay measurement value DLY_MS<0:2> corresponding to the total time of tD1 and tD2 by using the locking finishing signal DLL_LOC in a measurement mode after the locking operation is finished and generate the final output enable signal OE_FIN obtained by shifting the second output signal in response to the DLL clock signal CLK_DLL by an amount corresponding to the delay measurement value DLY_MS<0:2> and the CAS latency CL.

Figure 5:
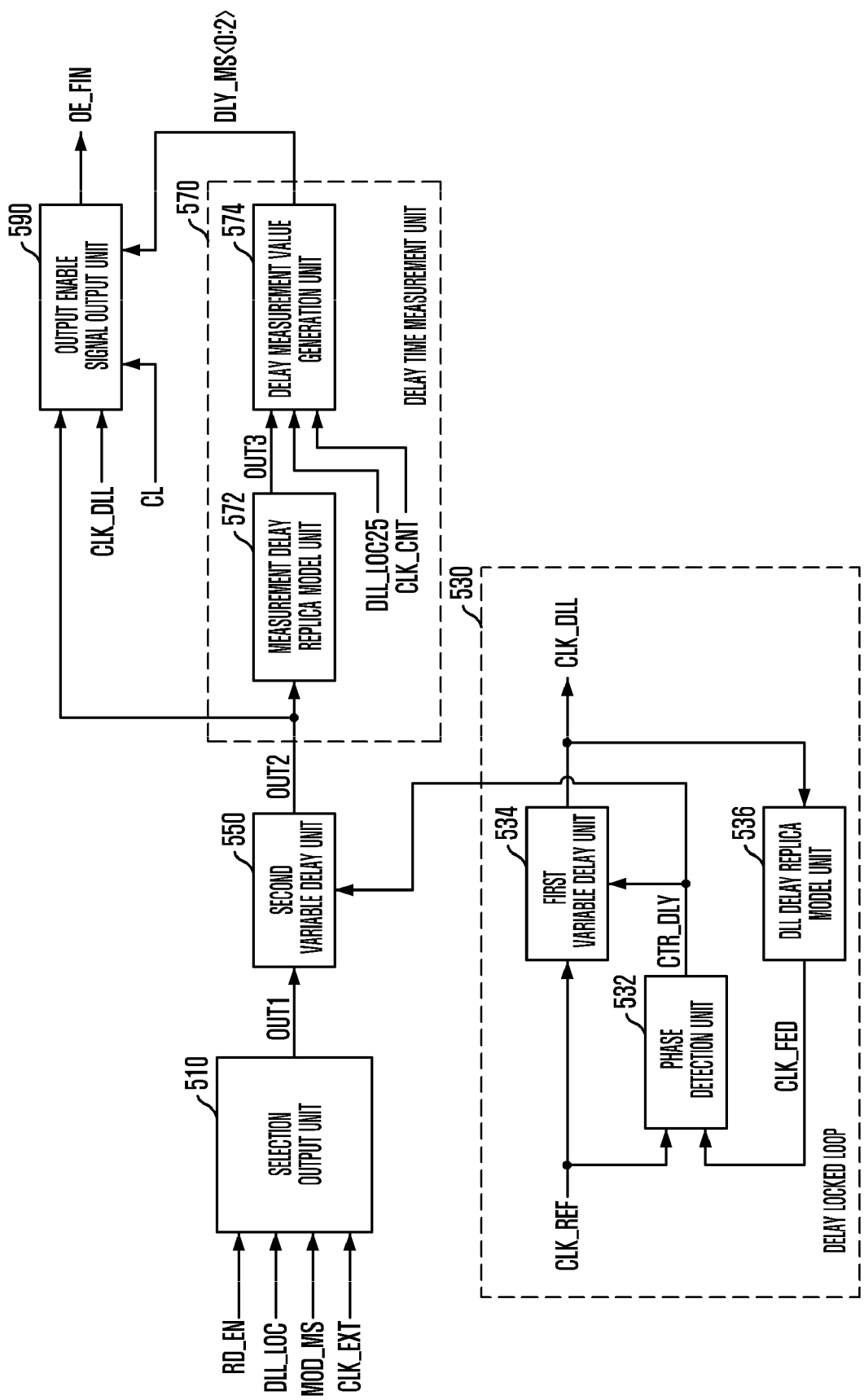
FIG. 5 is a block diagram illustrating some components of a semiconductor memory device in accordance with a second embodiment of the invention.

FIG. 5 is a block diagram illustrating some components of a semiconductor memory device in accordance with a second embodiment of the invention. For convenience of explanation, the same names are given to the same components in the first and second embodiments. Most of the components of the second embodiment are substantially the same as those of the first embodiment, however, in the second embodiment, a multiplexer circuit is further included in the selection output unit 510 including the read command signal synchronization unit 352 and the locking finishing signal synchronization unit 332 of the first embodiment so that one second variable delay unit 550 can be commonly used instead of the OE variably delay unit 354 and the measurement variable delay unit 334 constructed in the first embodiment.

Referring to FIG. 5, the semiconductor memory device includes a selection output unit 510, a delay locked loop 530, a second variable delay unit 550, a delay time measurement unit 570 and an output enable signal output unit 590.

The selection output unit 510 synchronizes a read command signal RD_EN and a locking finishing signal DLL_LOC with an external clock signal CLK_EXT in order to selectively output them according to a normal mode and a measurement mode. Herein, the normal mode means a mode for performing a read operation by receiving a read command after a locking operation of the delay locked loop 530 and the measurement mode means a mode for measuring several delay degrees reflected in the delay locked loop 530 before receiving the read command after the locking operation. Furthermore, as described in the first embodiment, the locking finishing signal DLL_LOC is a level signal for giving information of a locking finishing after the locking operation.

Figure 6:
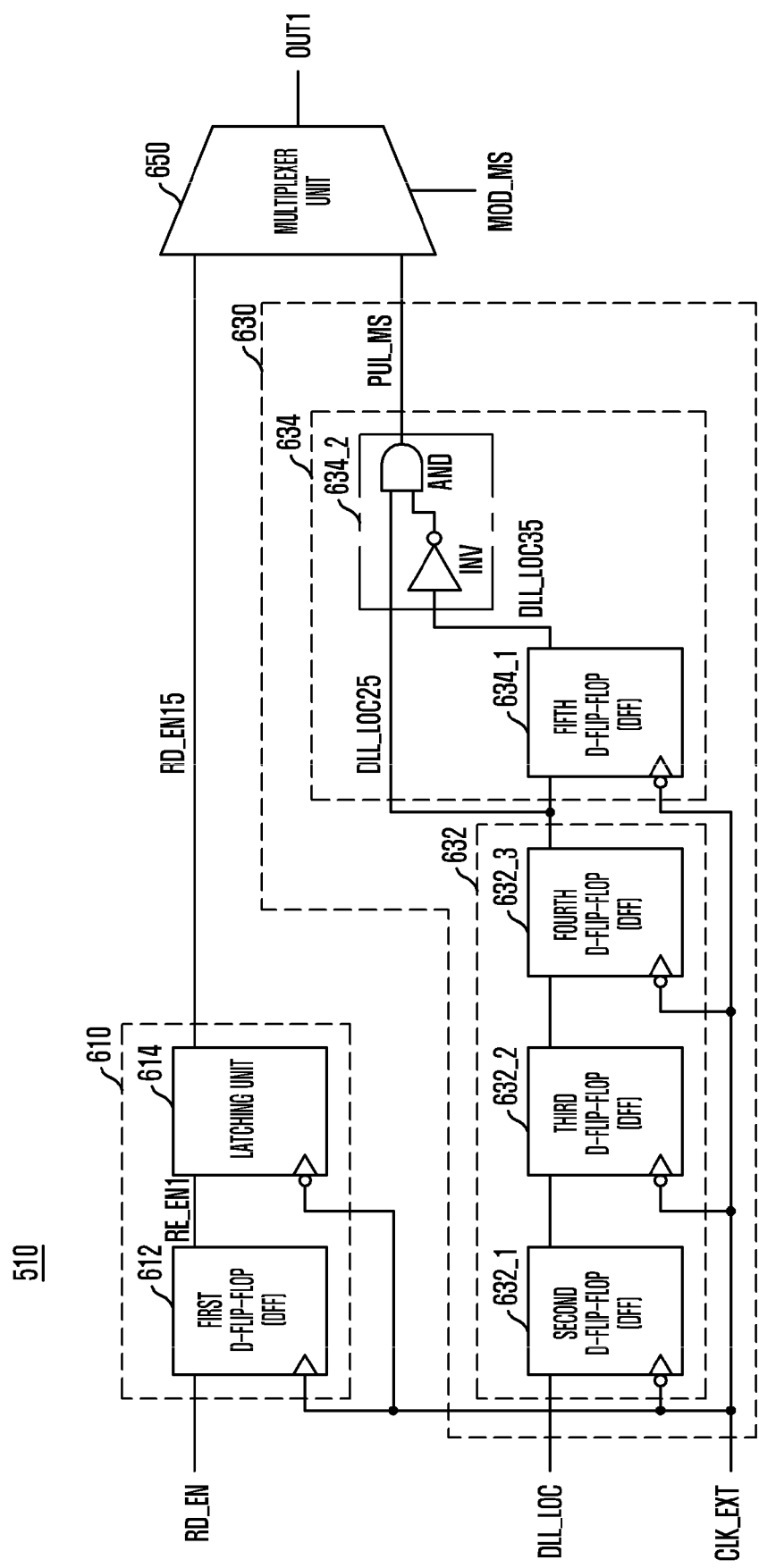
FIG. 6 is a diagram illustrating a selection output unit 510 shown in FIG. 5.

FIG. 6 is a diagram illustrating a selection output unit 510 shown in FIG. 5.

Referring to FIG. 6, the selection output unit 510 includes a read command signal synchronization unit 610, a locking finishing signal synchronization unit 630 and a multiplexer unit 650.

The read command signal synchronization unit 610 includes a first D-flip-flop 612 and a latching unit 614 to output the synchronized read command signal RD_EN15 by synchronizing the read command signal RD_EN with the external clock signal CLK_EXT in the normal mode.

Herein, the first D-flip-flop 612 outputs the read command signal RD_EN after synchronizing it with the external clock signal CLK_EXT and can be designed with a general D-Flip-Flop circuit (DFF) operating in response to a clock signal. The latching unit 614 receives an output signal of the first D-flip-flop 612 and outputs the synchronized read command signal RD_EN15 in response to the external clock signal CLK_EXT. Herein, the latching unit 614 can be designed with a general latch circuit operating in response to the clock signal. For reference, since in the normal mode, the synchronized read command signal RD_EN15 should be synchronized with a rising edge of the DLL clock signal CLK_DLL in the output enable signal output unit 590 after passing through the second variable delay unit 550 shown in FIG. 5, it is desirable that the synchronized read command signal RD_EN15 is outputted in synchronization with a falling edge of the external clock signal CLK_EXT in the latching unit 614.

Figure 7:
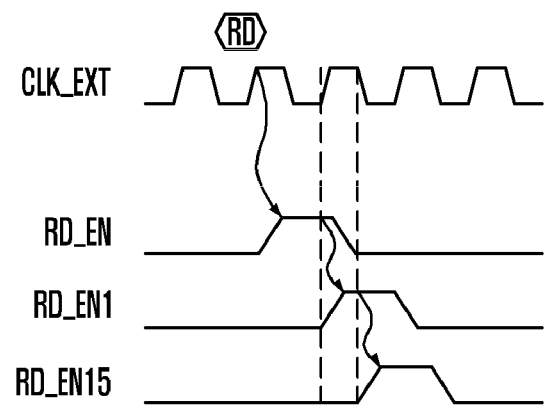
FIG. 7 is a waveform diagram illustrating an operation timing of a read command signal synchronization unit 610 shown in FIG. 6.

FIG. 7 is a waveform diagram illustrating an operation timing of the read command signal synchronization unit 610 shown in FIG. 6. In FIG. 7, the external clock signal CLK_EXT, the read command signal RD_EN, the output signal RD_EN1 of the first D-flip-flop 612 and the synchronized read command signal RD_EN15 are shown.

Hereafter, the invention will be described with reference to FIGS. 6 and 7.

First of all, if the read command RD is applied being synchronized with the external clock signal CLK_EXT, the read command signal RD_EN is activated. The first D-flip-flop 612 synchronizes the read command signal RD_EN in response to the rising edge of the external clock signal CLK_EXT and the latching unit 614 synchronizes the output signal RD_EN1 of the first D-flip-flop 612 with the falling edge of the external clock signal CLK_EXT in order to be outputted as the synchronized read command signal RD_EN15. Herein, the read command signal synchronization unit 610 may include a component for stably synchronizing the read command signal RD_EN with the external clock signal CLK_EXT and this is changeable depending on a design.

Referring back to FIG. 6, the locking finishing signal synchronization unit 630 includes a synchronization unit 632 and a pulse signal generation unit 634 to output a delay measurement pulse signal PUL_MS by synchronizing the locking finishing signal DLL_LOC with the external clock signal CLK_EXT in the measurement mode.

The synchronization unit 632 includes second to fourth D-flip-flops 632_1 632_2 and 632_3 to output a synchronized locking finishing signal DLL_LOC25 by synchronizing the locking finishing signal DLL_LOC with the external clock signal CLK_EXT.

The second D-flip-flop 632_1 can output the locking finishing signal DLL_LOC by synchronizing it with the external clock signal CLK_EXT, the third D-flip-flop 632_2 can output an output signal of the second D-flip-flop 632_1 by synchronizing it with the external clock signal CLK_EXT, and the fourth D-flip-flop 632_3 can output an output signal of the third D-flip-flop 632_2 by synchronizing it with the external clock signal CLK_EXT. Herein, the second to fourth D-flip-flops 632_1 632_2 and 632_3 may be formed by general D-flip-flop circuits. For reference, the second and third D-flip-flops 632_1 and 632_2 stably sets a setup/hold time of the locking finishing signal DLL_LOC and can be changed and omitted depending on a design.

Meanwhile, the pulse signal generation unit 634 includes a fifth D-flip-flop 634_1 and a pulse signal output unit 634_2 to generate the delay measurement pulse signal PUL_MS by receiving the synchronized locking finishing signal DLL_LOC25 generated by synchronizing the locking finishing signal DLL_LOC.

The fifth D-flip-flop 634_1 outputs the synchronized locking finishing signal DLL_LOC25 after synchronizing it with the external clock signal CLK_EXT and can be formed by a general D-flip-flop circuit. And, the pulse signal output unit 634_2 outputs the delay measurement pulse signal PUL_MS with a predetermined pulse width by receiving the synchronized locking finishing signal DLL_LOC25 and an output signal DLL_LOC35 of the fifth D-flip-flop 634_1 and includes an inverter INV for receiving the output signal DLL_LOC35 of the fifth D-flip-flop 634_1 and an AND gate AND for outputting the delay measurement pulse signal PUL_MS by receiving the synchronized locking finishing signal DLL_LOC25 and an output signal of the inverter INV.

Therefore, the pulse measurement pulse signal PUL_MS is activated in response to the synchronized locking finishing signal DLL_LOC25 and deactivated in response to the output signal DLL_LOC35 of the fifth D-flip-flop 634_1. Namely, the pulse width of the delay measurement pulse signal is determined by the synchronized locking finishing signal DLL_LOC25 and the output signal DLL_LOC35 of the fifth D-flip-flop 634_1. In other words, an activation width of the delay measurement pulse signal PUL_MS can correspond to a time in which the synchronized locking finishing signal DLL_LOC25 is activated and the output signal DLL_LOC35 of the fifth D-flip-flop 634_1 is activated.

Figure 8:
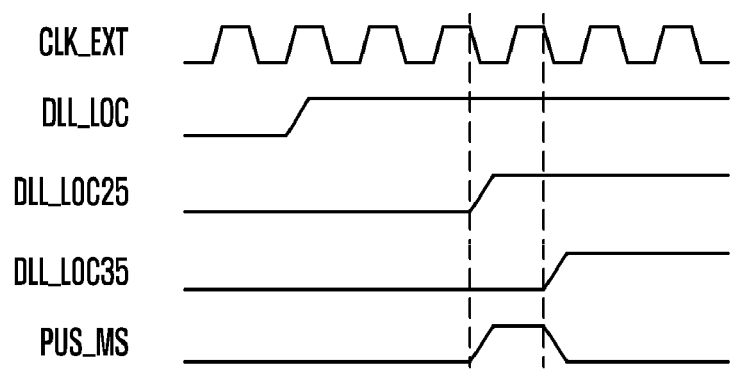
FIG. 8 is a waveform diagram illustrating an operation timing of a locking finishing signal synchronization unit 630 shown in FIG. 6.

FIG. 8 is a waveform diagram illustrating an operation timing of the locking finishing signal synchronization unit 630 shown in FIG. 6. In FIG. 8, the external clock signal CLK_EXT, the locking finishing signal DLL_LOC, the synchronized locking finishing signal DLL_LOC25, the output signal DLL_LOC35 of the fifth D-flip-flop 634_1 and the delay measurement pulse signal PUL_MS are shown.

Hereafter, the invention will be described with reference to FIGS. 6 and 8.

First of all, if the locking operation of the delay locked loop 530 is finished, the locking finishing signal DLL_LOC is activation-transited from logical 'low' to logical 'high'. As a result, the synchronized locking finishing signal DLL_LOC25 is activated in response to the falling edge of the external clock signal CLK_EXT. At this time, the delay measurement pulse signal PUL_MS becomes logical 'high' in response to the synchronized locking finishing signal DLL_LOC25. Thereafter, the output signal DLL_LOC35 of the fifth D-flip-flop 634_1 is activation-transited in response to the falling edge of the external clock signal CLK_EXT. At this time, the delay measurement pulse signal PUL_MS becomes logical 'low' in response to the output signal DLL_LOC35 of the fifth D-flip-flop 634_1.

Referring to FIG. 6 again, the multiplexer unit 650 outputs the synchronized read command signal RD_EN15 or the delay measurement pulse signal PUL_MS according to a delay measurement mode signal MOD_MS and can be formed by a general multiplexer circuit. Therefore, in the normal mode, for example, the delay measurement mode signal MOD_MS becomes logical 'low' so that the synchronized read command signal RD_EN15 can be outputted as a first output signal OUT1 and in the delay measurement mode, the delay measurement mode signal MOD_MS becomes logical 'high' so that the delay measurement pulse signal PUL_MS can be outputted as a first output signal OUT1.

The semiconductor memory device in accordance with the second embodiment of the invention can individually perform an operation in the normal mode and an operation in the measurement mode by including the selection output unit 510. That is, since the selection output unit 510 can output the corresponding signal as the first output signal OUT1 according to the normal mode and the measurement mode, the one variable delay unit 550 can be commonly used in both the normal mode and the measurement mode instead of the two variable delay units 334 and 354 in the first embodiment.

Referring to FIG. 5 again, the delay locked loop 530 generates the DLL clock signal CLK_DLL as an internal clock signal by receiving a reference clock signal CLK_REF and includes a phase detection unit 532, a first variable delay unit 534 and a DLL delay replica model unit 536. Herein, the reference clock signal may be a signal generated by buffering the external clock signal CLK_EXT. The construction and the operation of the delay locked loop 530 have been described in the first embodiment and so description thereof will be omitted.

The second variable delay unit 550 delays the first output signal OUT1 of the selection output unit 510 by corresponding to a delay degree between the reference clock signal CLK_REF and the DLL clock signal CLK_DLL, wherein it can output a second output signal by delaying the first output signal OUT1 by an amount corresponding to a delay control signal CTR_DLY. Herein, the second variable delay unit 550 can have a similar construction to that of the first variable delay unit 534 of the delay locked loop 530 and since it performs a delay operation by being controlled through the same delay control signal CTR_DLY, it can have the same delay time as that of the first variable delay unit 534.

The delay time measurement unit 570 measures a delay degree between the reference clock signal CLK_REF and a feedback clock signal CLK_FED by receiving the second output signal of the second variable delay unit 550 in order to output it as a delay measurement value DLY_MS<0:2> and includes a measurement delay replica model unit 572 and a delay measurement value generation unit 574.

The measurement delay replica model unit 572 delays the second output signal OUT2 of the second variable delay unit 550 by the delay degree between the DLL clock signal CLK_DLL and the feedback clock signal CLK_FED in order to output it as a third output signal OUT3. That is, since the measurement delay replica model unit 572 has a similar construction to that of the DLL delay replica model unit 536 of the delay locked loop 530, it can output the second output signal OUT2 of the second variable delay unit 550 as a third output signal OUT3 after delaying it by a delay time of a practical clock/data path. Herein, the measurement delay replica model unit 572 can receive the second output signal OUT2 of the second variable delay unit 550 only in the measurement mode. In this case, it is desirable that the measurement delay replica model unit 572 is designed in order to receive the second output signal OUT2 of the second variable delay unit 550 only in the measurement mode by additionally receiving the delay measurement mode signal MOD_MS.

The delay measurement value generation unit 574 counts counting clock signals CLK_CNT in response to the synchronized locking finishing signal DLL_LOC25 corresponding to the locking finishing signal DLL_LOC and the third output signal OUT3 of the measurement delay replica model unit 336 in order to generate it as the delay measurement value DLY_MS<0:2>. Herein, the delay measurement value DLY_MS<0:2> may use a 3 bit code signal, and this is changeable depending on a design. The delay measurement value DLY_MS<0:2> in accordance with the invention can have a value corresponding to the delay degree between the reference clock signal CLK_REF and the feedback clock signal CLK_FED after the locking operation of the delay locked loop 530 is finished. That is, the delay measurement value DLY_MS<0:2> has the value corresponding to a delay time in which the synchronized locking finishing signal DLL_LOC25 passes through the second variable delay unit 550 and the measurement delay replica model unit 572. In other words, since the second variable delay unit 550 is reflected by the same delay time as that of the DLL variable delay unit 534 and the measurement delay replica model unit 572 is reflected by the same delay time as that of the DLL delay replica model unit 536, the delay measurement value DLY_MS<0:2> has the value corresponding to the delay degree between the reference clock signal CLK_REF and the feedback clock signal CLK_FED.

Figure 9:
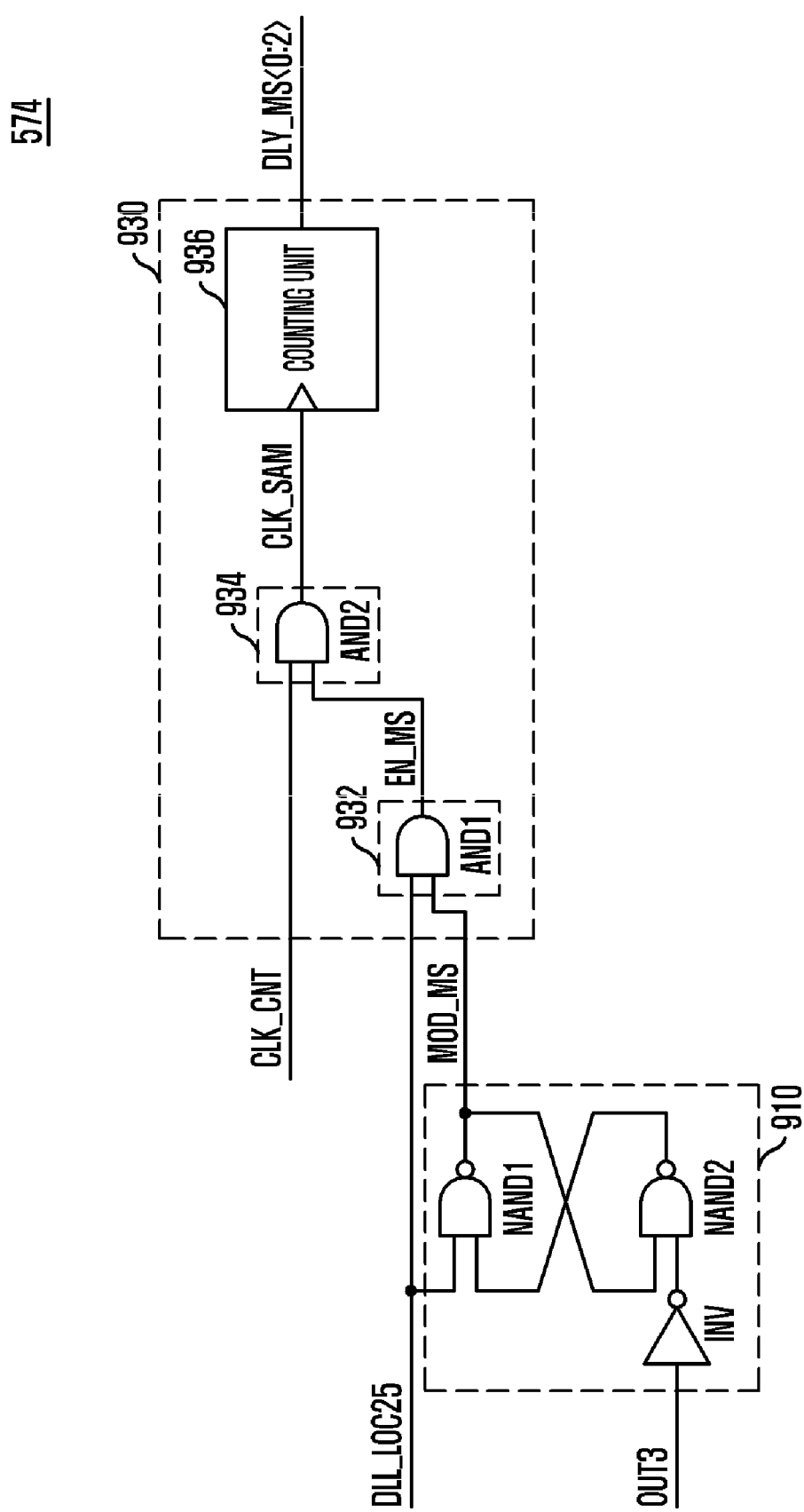
FIG. 9 is a diagram illustrating a delay measurement value generation unit 574 shown in FIG. 5.

FIG. 9 is a diagram illustrating the delay measurement value generation unit 574 shown in FIG. 5.

Referring to FIG. 9, the delay measurement value generation unit 574 includes a mode signal generation unit 910 and a delay measurement value counting unit 930.

The mode signal generation unit 910 generates the delay measurement mode signal MOD_MS in response to the synchronized locking finishing signal DLL_LOC25 and the third output signal OUT3 of the measurement delay replica model unit 572 and includes a first NAND gate NAND1 for generating the delay measurement mode signal MOD_MS by receiving the synchronized locking finishing signal DLL_LOC25 and an output signal of a second NAND gate NAND2, an inverter INV for receiving and inverting the third output signal OUT3 and a second NAND gate NAND2 for outputting values corresponding to an output signal of the first NAND gate NAND1 and an output signal of the inverter INV.

Therefore, the delay measurement mode signal MOD_MS can be kept in a set state in response to the synchronized locking finishing signal DLL_LOC25 and kept in a reset state in response to the third output signal OUT3. As described with reference to FIG. 8, the synchronized locking finishing signal DLL_LOC25 is the signal obtained by synchronizing the locking finishing signal DLL_LOC with the falling edge of the external clock signal CLK_EXT and as described with reference to FIG. 5, the third output signal OUT3 is the signal obtained by delaying the first output signal OUT1 by an amount corresponding to the second variable delay unit 550 and the measurement delay replica model unit 572. As a result, a reset time of the delay measurement mode signal MOD_MS can be a time at which the synchronized locking finishing signal DLL_LOC25 is outputted after passing through the second variable delay unit 550 and the measurement delay replica model unit 572 by being activated in the finished state of the locking operation.

Meanwhile, the delay measurement value counting unit 930 counts the counting clock signals CLK_CNT during a period defined by the synchronized locking finishing signal DLL_LOC25 and the delay measurement mode signal MOD_MS and includes an activation signal generation unit 932 and a sampling clock generation unit 934 and a counting unit 936.

Herein, the activation signal generation unit 932 generates an activation signal EN_MS of which an activation width is defined in response to the synchronized locking finishing signal DLL_LOC25 and the delay measurement mode signal MOD_MS and includes a first AND gate AND1 for receiving the synchronized locking finishing signal DLL_LOC25 and the delay measurement mode signal.

The sampling clock generation unit 934 samples the counting clock signals CLK_CNT in response to the activation signal EN_MS in order to output them as sampling clock signals CLK_SAM and includes a second AND gate AND2 for receiving the activation signal EN_MS and the counting clock signals CLK_CNT.

The counting unit 936 generates the delay measurement value DLY_MS<0:2> counted in response to the sampling clock signals CLK_SAM and includes a counter circuit for performing a counting operation in response to a clock signal. In the present embodiment, a counter for generating the 3 bit delay measurement value DLY_MS<0:2> by counting the sampling clock signals CLK_SAM is used as one example and can count the sampling clock signals CLK_SAM sampled during an activation period of the activation signal EN_MS. In other words, since the activation period of the activation signal EN_MS corresponds to the sum of a tD1 as a delay time reflected in the second variable delay unit 550 and a tD2 as a delay time reflected in the measurement delay replica model unit 572, it is desirable that the counting unit 936 is designed to generate the delay measurement value DLY_MS<0:2> by counting the sampling clock signals CLK_SAM sampled during the total time of tD1 and tD2.

Figure 10:
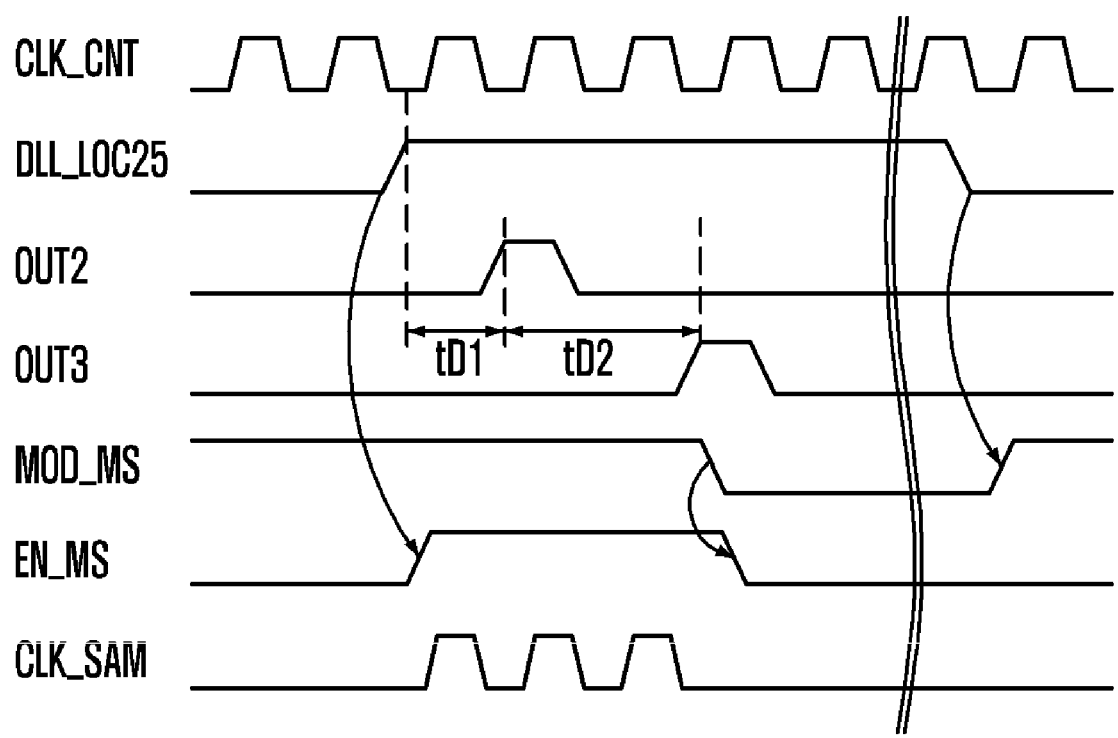
FIG. 10 is a waveform diagram illustrating an operation timing of the delay measurement value generation unit 574 shown in FIG. 9.

FIG. 10 is a waveform diagram illustrating an operation timing of the delay measurement value generation unit 574 shown in FIG. 9. In FIG. 10, the counting clock signal CLK_CNT, the synchronized locking finishing signal DLL_LOC25, the second output signal OUT2, the third output signal OUT3, the delay measurement mode signal MOD_MS, the activation signal EN_MS and the sampling clock signal CLK_SAM are shown.

Hereafter, the operation timing of the delay measurement value generation unit 574 will be described with reference to FIG. 5 and FIGS. 8 to 10.

First of all, if the locking finishing signal DLL_LOC (refer to FIG. 8) is activated, the synchronized locking finishing signal DLL_LOC25 is activated and then the corresponding delay measurement pulse signal PUL_MS (refer to FIG. 8) is activated. In the measurement mode, the delay measurement pulse signal PUL_MS is the first output signal OUT1 of the selection output unit 510 (refer to FIG. 5), the first output signal OUT1 is outputted as the second output signal OUT2 by being delayed by tD1 in the second variable delay unit 550 (refer to FIG. 5) and the second output signal OUT2 is outputted as the third output signal OUT3 by being delayed by tD2 in the measurement delay replica model unit 572. At this time, the mode signal generation unit 910 generates the delay measurement mode signal MOD_MS which is deactivated to logical 'low' in response to the synchronized locking finishing signal DLL_LOC25 and the third output signal OUT3. For reference, a logical 'high' period of the delay measurement mode signal MOD_MS is in the measurement mode for measuring the delay degree reflected to the delay locked loop 530 and a logical 'low' period is in the normal mode for performing an operation according to a read command.

Meanwhile, the activation period of the activation signal EN_MS is defined in response to the synchronized locking finishing signal DLL_LOC25 and the delay measurement mode signal MOD_MS. That is, the activation signal EN_MS is activated to logical 'high' in response to the synchronized locking finishing signal DLL_LOC25 and deactivated to logical 'low' in response to the delay measurement mode signal MOD_MS. Thereafter, the counting clock signals CLK_CNT are sampled in the sampling clock generation unit 934 during the activation period of the activation signal EN_MS to be outputted as the sampling clock signals CLK_SAM. The thus-generated sampling clock signals CLK_SAM are counted in the counting unit 936 to be outputted as the delay measurement value DLY_MS<0:2>. Herein, three counting clock signals CLK_CNT are sampled to generate the sampling clock signals CLK_SAM and the delay measurement value DLY_MS<0:2> has a counting value corresponding to three.

The synchronized locking finishing signal DLL_LOC25 is transited to logical 'low' in response to the locking finishing signal DLL_LOC (refer to FIG. 8) which is transited to logical 'low' in case that the delay locked loop 530 is reset, and therefore the delay measurement mode signal MOD_MS is activated to logical 'high' so that the semiconductor memory device in accordance with the invention can enter the measurement mode again.

Referring to FIG. 5 again, the output enable signal output unit 590 synchronizes the second output signal OUT2 of the second variable delay unit 550 with the DLL clock signal CLK_DLL in order to output the final output enable signal OE_FIN corresponding to the delay measurement value DLY_MS<0:2> and the CAS latency CL. The final output enable signal OE_FIN is a signal for securing the operation for outputting the data with matching with the CAS latency CL with respect to the external clock signal CLK_EXT. Herein, it is desirable that the output enable signal output unit 590 receives the second output signal OUT2 only in the normal mode.

In case of the normal mode, the read command signal RD_EN is outputted as the first output signal OUT1 by being synchronized in the selection output unit 510. That is, as described with reference to FIG. 6, the read command signal synchronized with the first output signal OUT1 is outputted. The first output signal OUT1 is outputted as the second output signal OUT2 by being delayed by tD1 in the second variable delay unit 550 and as described above, the second output signal OUT2 is positioned around the falling edge of the DLL clock signal CLK_DLL. The output enable signal output unit 590 outputs the second output signal OUT2 positioned around the falling edge of the DLL clock signal CLK_DLL as the final output enable signal OD_FIN in response to the rising edge of the DLL clock signal CLK_DLL. At this time, the final output enable signal OD_FIN can be outputted by corresponding to the CAS latency CL and the delay measurement value DLY_MS<0:2>.

Figure 11:
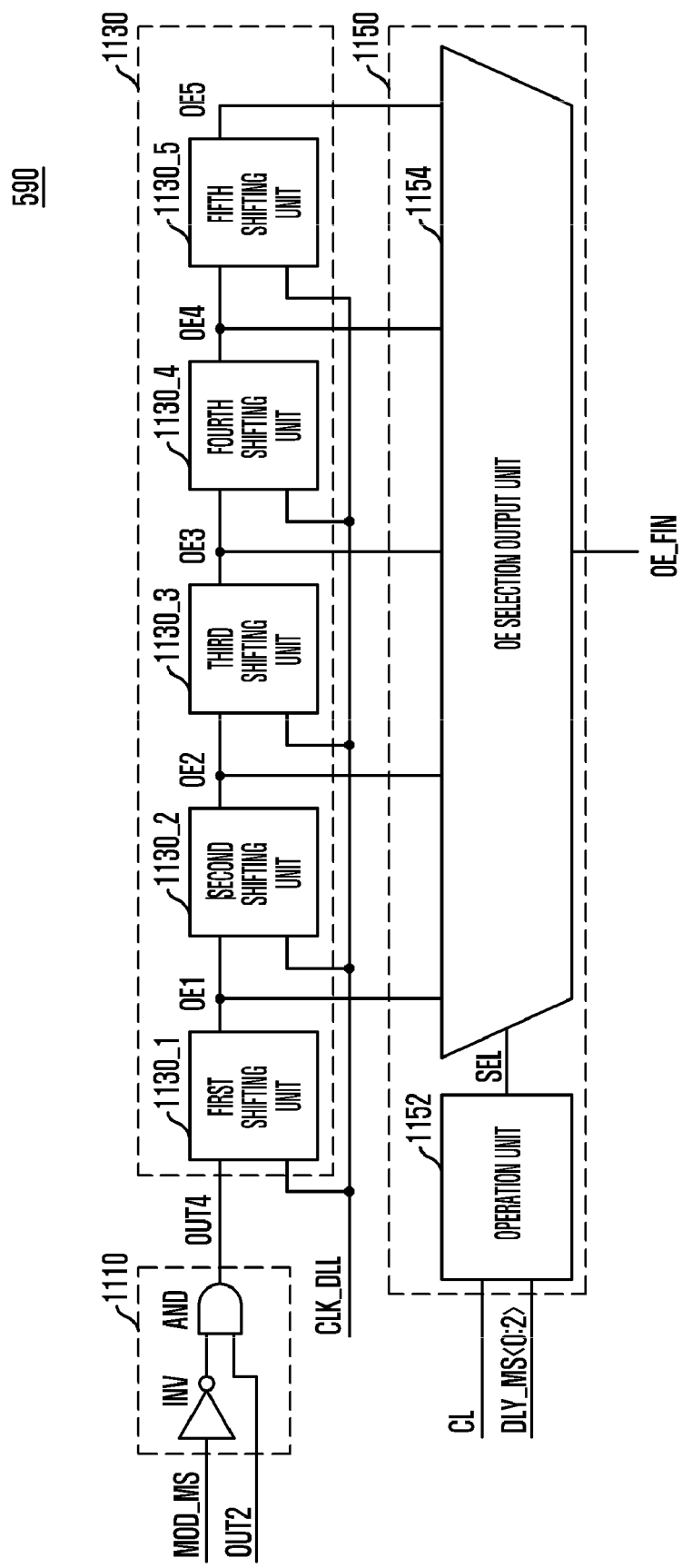
FIG. 11 is a diagram illustrating an output enable signal output unit 590 shown in FIG. 5.

FIG. 11 is a diagram illustrating the output enable signal output unit 590 shown in FIG. 5.

Referring to FIG. 11, the output enable signal output unit 590 includes a signal input unit 1110, a plurality of shifting units 1130 and a final output enable signal output unit 1150.

The signal input unit 1110 receives the second output signal OUT2 in the normal mode and includes an inverter INV for receiving the delay measurement mode signal MOD_MS and an AND gate AND for outputting a fourth output signal OUT4 by receiving the second output signal OUT2 and an output signal of the inverter INV. Therefore, the signal input unit 1110 receives the second output signal OUT2 in response to the delay measurement mode signal MOD_MS in order to output the corresponding fourth output signal OUT4. Herein, the delay measurement mode signal MOD_MS can be a signal which becomes logical 'low' in the normal mode and becomes logical 'high' in the measurement mode.

The plurality of shifting units 1130 shift the fourth output signal OUT4 of the signal input unit 1110 in response to the DLL clock signal CLK_DLL and includes first to fifth shifting units 1130_1, 1130_2, 1130_3, 1130_4 and 1130_5. Each of the first to fifth shifting units 1130_1, 1130_2, 1130_3, 1130_4 and 1130_5 outputs an inputted signal in response to the DLL clock signal CLK_DLL and can be designed with a general D-flip-flop. That is, the first shifting unit 1130_1 outputs the fourth output signal OUT4 as a first output enable signal OE1 in response to the DLL clock signal CLK_DLL, the second shifting unit 1130_2 outputs the first output enable signal OE1 as a second output enable signal OE2 in response to the DLL clock signal CLK_DLL, the third shifting unit 1130_3 outputs the second output enable signal OE2 as a third output enable signal OE3 in response to the DLL clock signal CLK_DLL, the fourth shifting unit 1130_4 outputs the third output enable signal OE3 as a fourth output enable signal OE4 in response to the DLL clock signal CLK_DLL and the fifth shifting unit 1130_5 outputs the fourth output enable signal OE4 as a fifth output enable signal OE5 in response to the DLL clock signal CLK_DLL.

At this time, it is desirable that each of the first to fifth shifting units 1130_1, 1130_2, 1130_3, 1130_4 and 1130_5 performs an output operation in response to the rising edge of the DLL clock signal CLK_DLL. For reference, the second output signal OUT 2 is designed to be positioned around the falling edge of the DLL clock signal CLK_DLL in order to be stably synchronized with the rising edge of the DLL clock signal CLK_DLL in the first to fifth shifting units 1130_1, 1130_2, 1130_3, 1130_4 and 1130_5. Furthermore, although in the present embodiment, the case including the first to fifth shifting units 1130_1, 1130_2, 1130_3, 1130_4 and 1130_5 is described as one example, the invention may be applied to cases including shifting units more than or less than the five shifting units depending on conditions.

Before describing the final output enable signal output unit 1150, operation timings of the plurality of shifting units 1130 will be described.

Figure 12:
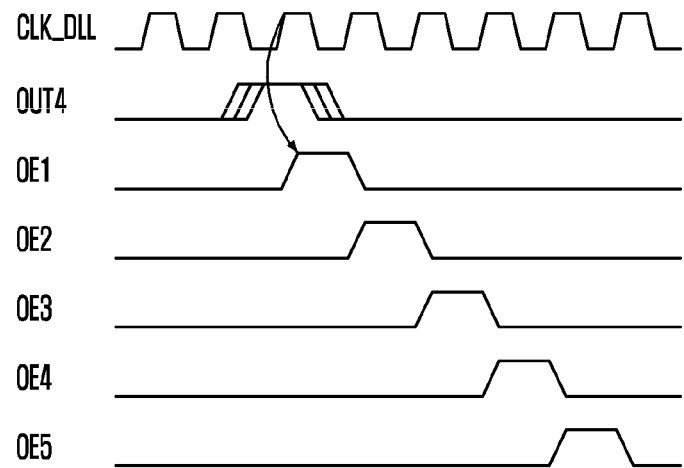
FIG. 12 is a waveform diagram illustrating operation timings of a plurality of shifting units 1130 shown in FIG. 11.

FIG. 12 is a waveform diagram illustrating the operation timings of the plurality of shifting units 1130 shown in FIG. 11. In FIG. 12, the DLL clock signal CLK_DLL, the fourth output signal OUT4, the first to fifth output enable signals OE1, OE2, OE3, OE4 and OE5 are shown.

Referring to FIGS. 11 and 12, first of all, the fourth output signal OUT4 can be positioned around the falling edge of the DLL clock signal CLK_DLL. The fourth output signal OUT4 is the first output enable signal OE1 in synchronization with the rising edge of the DLL clock signal in the first shifting unit 1130_1 and the first output enable signal OE1 is the second output enable signal OE in synchronization with the rising edge of the DLL clock signal CLK_DLL in the second shifting unit 1130_2. The third to fifth shifting units 1130_3, 1130_4 and 1130_5 also output the third to fifth output enable signals OE3, OE4 and OE5 by synchronizing each of the inputted signals with the rising edge of the DLL clock signal CLK_DLL.

Referring to FIG. 11 again, the final output enable signal output unit 1150 outputs any one of the first to fifth output enable signals OE1, OE2, OE3, OE4 and OE5, which are output signals of the first to fifth shifting units 1130_1, 1130_2, 1130_3, 1130_4 and 1130_5, as the final output enable signal OE_FIN in response to the CAS latency CL and the delay measurement value DLY_MS<0:2>. Herein, the final output enable signal output unit 1150 includes an operation unit 1152 and an OE selection output unit 1154.

The operation unit 1152 outputs a selection signal SEL for selecting the first to fifth output enable signals OE1, OE2, OE3, OE4 and OE5 by operating the CAS latency CL and the delay measurement value DLY_MS<0:2>. At this time, the selected output enable signal is the final output enable signal OE_FIN for securing an operation for outputting data with matching with the CAS latency CL after the read command. Herein, the selection signal SEL can be a signal corresponding to each of the first to fifth output enable signal OE1, OE2, OE3, OE4 and OE5 and the operation unit 1152 can be designed with an operation circuit for subtracting the delay measurement value DLY_MS<0:2> from the CAS latency CL.

The OE selection output unit 1154 outputs any one of the first to fifth output enable signals OE1, OE2, OE3, OE4 and OE5 as the final output enable signal OE_FIN in response to the selection signal and can be designed with a general multiplexer circuit.

With reference to FIGS. 4A and 4B again, the simple operation of the output enable signal output unit 590 will be described. For convenience of explanation, a time in which the read command signal RD_EN is changed to the synchronized read command signal RD_EN15 is not considered.

With reference to FIG. 4A and FIG. 11, if the sampling clock signal CLK_SAM is toggled one time by corresponding to 1tCK as the total time of tD1 and tD2 in the measurement mode, the operation unit 1152 performs an operation for subtracting 1 as the delay measurement value DLY_MS<0:2> corresponding to the sampling clock signal CLK_SAM toggled one time from the CAS latency CL 5 in order to output the corresponding selection signal SEL. The selection output unit 1150 selects the fourth output enable signal OE4 which is not yet activated through the selection signal SEL in order to output it as the final output enable signal OE_FIN.

If the read command RD is applied in the normal mode, the second output signal OUT2 obtained by delaying the first output signal OUT1 activated by corresponding to the applied read command by tD1 is activated and thus the fourth output signal OUT4 is also activated. Thereafter, the plurality shifting units 1130 shift the fourth output signal OUT4 in response to the DLL clock signal CLK_DLL. Since it is already determined in the measurement mode that the fourth output enable signal OE4 is outputted as the final output enable signal OE_FIN, the fourth output enable signal OE4 activated by shifting the fourth output signal OUT4 four times can be outputted as the final output enable signal OD_FIN.

Referring to FIG. 4B and FIG. 11, if the sampling clock signal CLK_SAM is toggled two times by corresponding to 2tCK as the total time of tD1 and tD2 in the measurement mode, the operation unit 1152 performs an operation for subtracting 2 as the delay measurement value DLY_MS<0:2> corresponding to the sampling clock signal CLK_SAM toggled two times from the CAS latency CL 5 in order to output the corresponding selection signal SEL. The selection output unit 1150 selects the third output enable signal OE3 which is not yet activated through the selection signal SEL in order to output it as the final output enable signal OE_FIN.

If the read command RD is applied in the normal mode, the second output signal OUT2 obtained by delaying the first output signal OUT1 activated by corresponding to the applied read command by tD1 is activated and thus the fourth output signal OUT4 is also activated. Thereafter, the plurality shifting units 1130 shift the fourth output signal OUT4 in response to the DLL clock signal CLK_DLL. Since it is already determined in the measurement mode that the third output enable signal OE3 is outputted as the final output enable signal OE_FIN, the third output enable signal OE3 activated by shifting the fourth output signal OUT4 three times can be outputted as the final output enable signal OD_FIN.

As described above, the conventional semiconductor memory device continuously consumes power due to the counting and comparison operations before the read command is applied. However, the semiconductor memory device in accordance with the invention can minimize unnecessarily consumed power before the read command is applied by selecting the final output enable signal OE_FIN before the read command is applied. Furthermore, the semiconductor memory device in accordance with the invention can secure a high speed circuit operation by generating the final output enable signal OE_FIN corresponding to the CAS latency without a counter and a comparison unit which were provided conventionally.

Meanwhile, as shown in FIG. 12, the fourth output signal OUT4 can be positioned around a falling edge of a DLL clock signal CLK_DLL. Therefore, some margin is generated between the fourth output signal OUT4 and a rising edge of the DLL clock signal CLK_DLL. Herein, assuming that the fourth output signal OUT4 is almost the same signal of the second output signal OUT2 of the second variable delay unit 550 (refer to FIG. 5), a unit delay amount of the second variable delay unit 550 is not necessary to be densely designed like a unit delay amount of the first variable delay unit 534. That is, it is possible to largely design the unit delay amount of the second variable delay unit 550 according to the some margin. Practically, the first variable delay unit 534 of the delay locked loop 530 includes a plurality of unit delay cells and are controlled at very dense unit delay time intervals in response to the delay control signal CTR_DLY.

Figure 13:
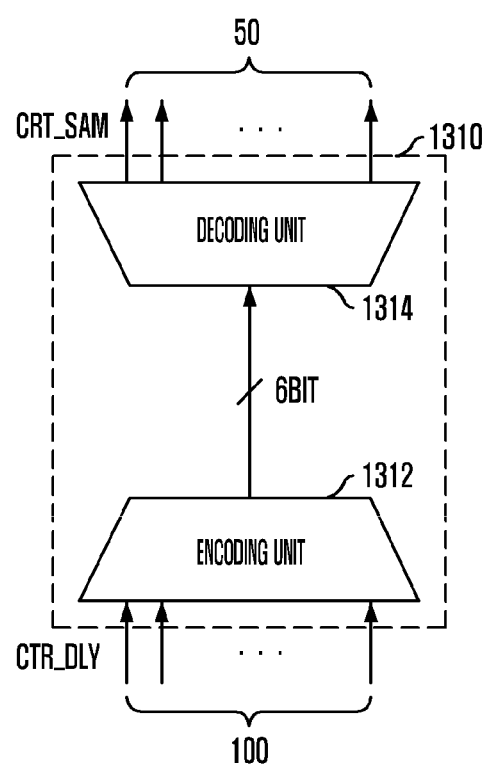
FIG. 13 is a block diagram illustrating a control signal inputted to a second variable delay unit 550 shown in FIG. 5.

FIG. 13 is a block diagram illustrating a control signal inputted to the second variable delay unit 550 shown in FIG. 5.

With reference to FIG. 5 and FIG. 13, a control signal sampling unit 1310 generates a plurality of sampling control signals CTR_SAM for controlling the second variable delay unit 550 by sampling a plurality of delay control signals CTR_DLY outputted from the phase detection unit 533 and includes an encoding unit 1312 and a decoding unit 1314. Herein, for convenience of explanation, it is assumed that the number of delay control signals CTR_DLY is 100, the number of sampling control signals CTR_SAM is 50 and output signal of encoding the 100 delay control signals CTR_DLY are 6-bit.

The encoding unit 1312 generates 6-bit output signals by receiving and encoding the 100 delay control signals CTR_DLY and the decoding unit 1314 generates the 50 sampling control signals CTR_SAM by decoding the 6-bit output signals. That is, the first variable delay unit 534 is controlled per minute delay unit by including unit delay cells corresponding to the 100 delay control signals CTR_DLY and the second variable delay unit 550 can be controlled per large delay unit by including unit delay cells corresponding to the 50 sampling control signals CTR_SAM. In this case, the second variable delay unit 550 can be designed to be smaller than the first variable delay unit 534. In other words, the semiconductor memory device in accordance with the invention can employ a reduced size second variable delay unit 550 through such a design, thereby reducing the burden of the layout in the chip design.

The semiconductor device in accordance with the invention can generate the final output enable signal corresponding to the CAS latency by measuring the various delay degrees reflected in the delay locked loop when the locking operation of the delay locked loop is finished and reflecting the delay degrees to the read command. And, the semiconductor device in accordance with the invention, unlike a conventional semiconductor device, can set the final output enable signal corresponding to the CAS latency before the read command is applied. The semiconductor device in accordance with the invention can generate the final output enable signal corresponding to the CAS latency without designing a counter and a comparator, which conventionally causes several problems due to an inevitable design change according to the CAS latency. Therefore, the semiconductor device in accordance with the invention is suitable for a development direction oriented toward high speed and low electric power.

Furthermore, the chip size of the semiconductor memory device can be reduced by designing the variable delay circuit used in the normal mode and the measurement mode to be efficiently controlled.

In accordance with the invention, the power consumed before the read command is applied can be minimized by selecting the output enable signal corresponding to the CAS latency information before the read command by measuring the various delay degrees reflected in the delay locked loop.

Furthermore, in accordance with the invention, high-speed operation can be implemented in spite of the increment of the CAS latency by generating the final enable signal corresponding to the CAS latency information without designing and providing a conventional counter and comparator.

While the invention has been described with respect to the specific embodiments, it will be apparent to those skilled in the art that various changes and modifications may be made without departing from the spirit and scope of the invention as defined in the following claims.

What is claimed is:

1. A semiconductor memory device, comprising:
    a delay locked loop configured to generate a delay control signal corresponding to a detected phase difference between a reference clock signal and a feedback clock signal by detecting the phase difference, and to generate a delay locked loop (DLL) clock signal by delaying the reference clock signal an amount corresponding to the delay control signal, and to delay the feedback clock signal by a DLL delay time by which the DLL clock signal would be delayed by a practical clock/data path;

a delay time measurement device configured to measure a first degree of delay between the reference clock signal and the feedback clock signal in response to locking finishing information synchronized with an external clock signal and to output the first degree of delay as a delay measurement value; and an output enable signal generation device configured to delay read command information synchronized with the external clock signal by a second degree of delay between the reference clock signal and the DLL clock signal and generate the read command information as a final output enable signal by synchronizing the read command information with the DLL clock signal in response to both the delay measurement value and Column Address Strobe (CAS) latency information.

2. The semiconductor memory device of claim 1, wherein the delay time measurement device includes:

a measurement variable delay unit configured delay the synchronized locking finishing information by an amount corresponding to the delay control signal;

a delay replica model unit configured to delay an output signal of the measurement variable delay unit by a third degree of delay between the DLL clock signal and the feedback clock signal; and a delay measurement value generation unit configured to generate the delay measurement value by counting one or more counting clock signals in response to the synchronized locking finishing information and an output signal of the measurement delay replica model unit.

3. The semiconductor memory device of claim 2, wherein the delay measurement value generation unit includes:

a mode signal generation unit configured to generate a delay measurement mode signal in response to the synchronized locking finishing information and the output signal of the measurement delay replica model unit; and a delay measurement value counting unit configured to count the counting clock signals during a period defined by the synchronized locking finishing information and the delay measurement mode signal.

4. The semiconductor memory device of claim 3, wherein the delay measurement mode signal is kept in a set state in response to the synchronized locking finishing signal and kept in a reset state in response to the output signal of the delay replica model unit.

5. The semiconductor memory device of claim 3, wherein the delay measurement value counting unit includes:

an activation signal generation unit configured to generate an activation signal in response to the synchronized locking finishing signal and the delay measurement mode signal;

a sampling clock generation unit configured to generate sampling clock signals by sampling the counting clock signals, in response to the activation signal; and a counting unit configured to output the delay measurement value in response to the sampling clock signals.

6. The semiconductor memory device of claim 5, wherein an activation width of the activation signal is defined in response to the locking finishing signal and the delay measurement mode signal.

7. The semiconductor memory device of claim 2, further comprising a control signal sampling device configured to generate a sampling control signal for controlling the measurement variable delay unit and an output enable (OE) variable delay unit by sampling the delay control signal.

8. The semiconductor memory device of claim 7, wherein the control signal sampling device includes an encoding unit configured to encode the delay control signal, and a decoding unit configured to generate the sampling control signal by decoding an output signal of the encoding unit.

9. The semiconductor memory device of claim 7, wherein the measurement variable delay unit and the OE variable delay unit include unit delay cells corresponding to the sampling control signal.

10. The semiconductor memory device of claim 1, wherein the output enable signal generation device includes:

an output enable (OE) variable delay unit configured to output synchronized read command information by delaying the read command information by the amount corresponding to the delay control signal; and an output enable signal output unit configured to synchronize an output signal of the OE variable delay unit with the DLL clock signal and output the output signal of the OE variable delay unit as the final output enable signal in response to the CAS latency information and the delay measurement value.

11. The semiconductor memory device of claim 10, wherein the output enable signal output unit includes:

a signal input unit configured to receive the output signal of the OE variable delay unit in a normal mode;

a plurality of shifting units configured to shift output signals of the signal input unit in response to the DLL clock signal; and a final output enable signal output unit configured to output any one of a plurality of output signals of the plurality of shifting units as the final output enable signal in response to the CAS latency information and the delay measurement value.

12. The semiconductor memory device of claim 11, wherein the normal mode is a mode for performing a read operation by activating the read command information after a locking operation of the delay locked loop.

13. The semiconductor memory device of claim 11, wherein the final output enable signal output unit includes:

an operation unit configured to output a selection signal in response to the CAS latency information and the delay measurement value; and a selection output unit configured to output any one of the plurality of output signals of the plurality of shifting units in response to the selection signal.

14. The semiconductor memory device of claim 13, wherein the final output enable signal is selected from any one of the output signals of the plurality of shifting units before the read command information is activated and the final output enable signal is activated in response to the read command information.

15. A semiconductor memory device, comprising:

a selection output device configured to selectively output read command information and locking finishing information according to a normal mode and a measurement mode by synchronizing the read command information and the locking finishing information with an external clock signal;

a delay locked loop configured to generate a delay control signal corresponding to a detected phase difference between a reference clock signal and a feedback clock signal by detecting the phase difference, and to generate a delay locked loop (DLL) clock signal by delaying the reference clock signal by an amount corresponding to the delay control signal, and to delay the feedback clock signal by a delay time by which the DLL clock signal would be delayed by a practical clock/data path;

a variable delay device configured to delay an output signal of the selection output device by a second degree of delay between the reference clock signal and the DLL clock signal;

a delay time measurement unit configured to receive an output signal of the variable delay device, measure a first degree of delay between the reference clock signal and the feedback clock signal and output the first delay degree as a delay measurement value; and an output enable signal output device configured to synchronize the output signal of the variable delay device with the DLL clock signal and output the output signal of the output enable signal output device as a final output enable signal in response to the delay measurement value and column address strobe (CAS) latency information.

16. The semiconductor memory device of claim 15, wherein the normal mode is a mode for performing a read operation by activating the read command information after a locking operation of the delay locked loop, and the measurement mode is a mode for measuring the first and second delay degrees in the delay locked loop before the read command information is activated after the locking operation of the delay locked loop.

17. The semiconductor memory device of claim 15, wherein the selection output device includes:
   a read command signal synchronization unit configured to output the read command information by synchronizing the read command information with the external clock signal in the normal mode;
   a locking finishing signal synchronization unit configured to output the locking finishing information by synchronizing the locking finishing information with the external clock signal in the measurement mode; and
   a multiplexer unit configured to output an output signal of the read command signal synchronization unit or an output signal of the locking finishing signal synchronization unit in the normal mode and the measurement mode respectively.

18. The semiconductor memory device of claim 17, wherein the locking finishing signal synchronization unit includes:
   a synchronization unit configured to output a synchronized locking finishing signal by synchronizing the locking finishing information with the external clock signal; and
   a pulse signal generation unit configured to generate a delay measurement pulse signal with a predetermined pulse width in response to the synchronized locking finishing signal.

19. The semiconductor memory device of claim 15, wherein the variable delay device delays the output signal of the selection output device by an amount corresponding to the delay control signal.

20. The semiconductor memory device of claim 15, wherein the variable delay device is used in both the normal mode and the measurement mode.

21. The semiconductor memory device of claim 18, wherein the delay time measurement unit includes:
   a measurement delay replica model unit configured to delay the output signal of the variable delay device by a third degree of delay between the DLL clock signal and the feedback clock signal; and a delay measurement value generation unit configured to generate the delay measurement value obtained by counting a plurality of counting clock signals in response to the synchronized locking finishing signal and an output signal of the measurement delay replica model unit.

22. The semiconductor memory device of claim 21, wherein the delay measurement value generation unit includes:
   a mode signal generation unit configured to generate a delay measurement mode signal in response to the synchronized locking finishing signal and the output signal of the measurement delay replica model unit; and
   a delay measurement value counting unit configured to count the plurality of counting clock signals during a period defined by the synchronized locking finishing signal and the delay measurement mode signal.

23. The delay semiconductor memory device of claim 22, wherein the delay measurement mode signal is kept in a set state in response to the synchronized locking finishing signal and kept in a reset state in response to the output signal of the delay replica model unit.

24. The delay semiconductor memory device of claim 22, wherein the delay measurement counting unit includes:
   an activation signal generation unit configured to generate an activation signal in response to the synchronized locking finishing signal and the delay measurement mode signal;
   a sampling clock generation unit configured to generate sampling clock signals by sampling the counting clock signals in response to the activation signal; and
   a counting unit configured to output the delay measurement values in response to the sampling clock signals.

25. The semiconductor memory device of claim 24, wherein an activation width of the activation signal is defined in response to the locking finishing information and the delay measurement mode signal.

26. The semiconductor memory device of claim 15, wherein the output enable signal output unit includes:
   a signal input unit configured to receive the output signal of the variable delay unit in the normal mode;
   a plurality of shifting units configured to shift output signals of the signal input unit in response to the DLL clock signal; and
   a final output enable signal output unit configured to output any one of a plurality of output signals of the plurality of shifting units as the final output enable signal in response to the CAS latency information and the delay measurement value.

27. The semiconductor memory device of claim 26, wherein the final output enable signal output unit includes:
   an operation unit configured to output a selection signal in response to the CAS latency information and the delay measurement value; and
   a selection output device configured to output any one of the plurality of output signals of the plurality of shifting units in response to the selection signal.

28. The semiconductor memory device of claim 26, wherein the final output enable signal is
   selected by any one of the output signals of the plurality of shifting units before the read command information is activated, and
   activated in response to the read command information.

29. The semiconductor memory device of claim 15, further comprising:

a control signal sampling device configured to generate a sampling control signal for controlling the variable delay unit by sampling the delay control signal.

30. The semiconductor memory device of claim 29, wherein the control signal sampling device includes an encoding unit configured to encode the delay control signal, and a decoding unit configured to generate the sampling control signal by decoding an output signal of the encoding unit.

31. The semiconductor memory device of claim 29, wherein the variable delay unit includes a unit delay cell corresponding to the sampling control signal.

32. An operation method of a semiconductor memory device, comprising:

generating a delay control signal corresponding to a detected phase difference between a reference clock signal and a feedback clock signal by detecting the phase difference, generating a delay locked loop (DLL) clock signal by delaying the reference clock signal by an amount corresponding to the delay control signal and delaying the feedback clock signal by a delay time by which the DLL clock signal would be delayed by a practical clock/data path;

generating a delay measurement value by measuring a first degree of delay between the reference clock signal and the feedback clock signal after a locking operation; and generating a final output enable signal according to the delay measurement value and column address strobe (CAS) latency and in response to a read command.

33. The method of claim 32, wherein generating the delay measurement value includes:

delaying a locking finishing signal activated in the locking operation by the degree of delay between the reference clock signal and the feedback clock signal; and outputting the delay measurement value by counting counting clock signals during an activation period defined by the locking finishing signal and the delayed signal.

34. The method of claim 32, wherein generating the final output enable signal includes delaying the read command by a second degree of delay between the reference clock signal and the DLL clock signal to generate a delayed signal;

shifting the delayed signal in response to the DLL clock signal to generate shifted signals; and selecting the final output enable signal from among the shifted signals according to the delay measurement value and the CAS latency.

* * * * *

UNITED STATES PATENT AND TRADEMARK OFFICE
CERTIFICATE OF CORRECTION

PATENT NO. : 7,881,132 B2
APPLICATION NO. : 12/346819
DATED : February 1, 2011
INVENTOR(S) : Shin It is certified that error appears in the above-identified patent and that said Letters Patent is hereby corrected as shown below:

Title Page
Change FOREIGN PATENT DOCUMENTS portion of item (56) for References Cited as follows:

FOREIGN PATENT DOCUMENTS

KR 1020030039178 A   5/2003
KR 1020050097700 A   10/2005
KR 1020060062426 A   6/2006
KR     100728971 B1   6/2007

Signed and Sealed this
Twenty-second Day of March, 2011

David J. Kappos
*Director of the United States Patent and Trademark Office*